United States Patent
Iwasaki et al.

(10) Patent No.: US 10,439,585 B2
(45) Date of Patent: Oct. 8, 2019

(54) ACOUSTIC WAVE DEVICE INCLUDING MULTIPLE DIELECTRIC FILMS

(71) Applicant: SKYWORKS FILTER SOLUTIONS JAPAN CO., LTD., Kadoma-Shi (JP)

(72) Inventors: Tomohiro Iwasaki, Shiga-Ken (JP); Hiroyuki Nakamura, Osaka-Fu (JP); Toru Yamaji, Kyoto-Fu (JP); Mitsunori Miyanari, Osaka-Fu (JP); Masahiro Yasumi, Osaku-Fu (JP); Shoji Okamoto, Osaka-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 484 days.

(21) Appl. No.: 15/332,279

(22) Filed: Oct. 24, 2016

(65) Prior Publication Data

US 2017/0040969 A1    Feb. 9, 2017

Related U.S. Application Data

(63) Continuation of application No. 14/176,149, filed on Feb. 10, 2014, now Pat. No. 9,496,846.

(30) Foreign Application Priority Data

Feb. 15, 2013 (JP) .................................. 2013-027414
Mar. 11, 2013 (JP) .................................. 2013-047493
Sep. 11, 2013 (JP) .................................. 2013-187919

(51) Int. Cl.
*H03H 3/10*    (2006.01)
*H03H 3/08*    (2006.01)
(Continued)

(52) U.S. Cl.
CPC .......... *H03H 9/02559* (2013.01); *H03H 3/08* (2013.01); *H03H 3/10* (2013.01);
(Continued)

(58) Field of Classification Search
CPC .................................................. H03H 9/02559
(Continued)

(56) References Cited

U.S. PATENT DOCUMENTS

| 7,939,989 | B2 | 5/2011 | Solal et al. |
| 8,531,255 | B2 | 9/2013 | Loseu |

(Continued)

FOREIGN PATENT DOCUMENTS

| JP | S51-3183 A | 1/1976 |
| JP | S52-9389 A | 1/1977 |

(Continued)

*Primary Examiner* — Thomas M Dougherty
*Assistant Examiner* — Karen B Addison
(74) *Attorney, Agent, or Firm* — Lando & Anastasi, LLP

(57) ABSTRACT

An acoustic wave device comprises an IDT electrode disposed above an upper surface of a piezoelectric substrate and includes a plurality of electrode fingers configured to excite a main acoustic wave. A first dielectric film made of an oxide is disposed above the upper surface of the piezoelectric substrate and covers the plurality of electrode fingers. A second dielectric film made of non-oxide is disposed between the first dielectric film and each of the plurality of electrode fingers. A third dielectric film is disposed between the piezoelectric substrate and the plurality of electrode fingers. A speed of a transverse wave propagating through the third dielectric film is greater than a speed of the main acoustic wave propagating through the piezoelectric substrate. The third dielectric film contacts the first dielectric film between adjacent electrode fingers of the plurality of electrode fingers.

24 Claims, 16 Drawing Sheets

(51) Int. Cl.
*H03H 9/02* (2006.01)
*H03H 9/13* (2006.01)

(52) U.S. Cl.
CPC .... *H03H 9/02834* (2013.01); *H03H 9/02937* (2013.01); *H03H 9/02984* (2013.01); *H03H 9/131* (2013.01); *H03H 9/132* (2013.01)

(58) Field of Classification Search
USPC .................................................. 310/313 B
See application file for complete search history.

(56) References Cited

U.S. PATENT DOCUMENTS

| | | |
|---|---|---|
| 8,698,578 B2 | 4/2014 | Nakanishi et al. |
| 2004/0070313 A1 | 4/2004 | Furukawa et al. |
| 2007/0096592 A1 | 5/2007 | Kadota et al. |
| 2012/0104897 A1 | 5/2012 | Nishiyama et al. |
| 2013/0335170 A1 | 12/2013 | Ikuta et al. |
| 2014/0232239 A1* | 8/2014 | Iwasaki .............. H03H 9/02984 310/313 C |

FOREIGN PATENT DOCUMENTS

| | | |
|---|---|---|
| JP | H10145171 A | 5/1998 |
| JP | 2000502236 A | 2/2000 |
| JP | 2008067289 A | 3/2008 |
| JP | 2008109413 A | 5/2008 |
| JP | 2011135245 A | 7/2011 |
| JP | 2013201468 A | 10/2013 |
| WO | 2003058813 | 7/2003 |
| WO | 2005034347 A1 | 4/2005 |
| WO | 2012098816 A1 | 7/2012 |
| WO | 2012102131 A1 | 8/2012 |

\* cited by examiner

ACOUSTIC WAVE DEVICE INCLUDING MULTIPLE DIELECTRIC FILMS

CROSS-REFERENCE TO RELATED APPLICATIONS

This application claims priority under 35 U.S.C. §120 as a continuation of U.S. patent application Ser. No. 14/176,149 titled "ACOUSTIC WAVE DEVICE AND ELECTRONIC APPARATUS INCLUDING SAME," filed Feb. 10, 2014. U.S. patent application Ser. No. 14/176,149 claims priority under 35 U.S.C. §119 to Japanese Patent Application No. 2013-027414, filed Feb. 15, 2013, Japanese Patent Application No. 2013-047493, filed Mar. 11, 2013, and to Japanese Patent Application No. 2013-187919, filed Sep. 11, 2013. The content of each of these applications is incorporated herein in its entirety for all purposes.

TECHNICAL FIELD

The present invention relates to an acoustic wave device and an electronic apparatus including the acoustic wave device.

BACKGROUND ART

FIG. 22 is a cross-sectional view of conventional acoustic wave device 101. Acoustic wave device 101 includes piezoelectric substrate 102, IDT electrode 103A formed on piezoelectric substrate 102, and dielectric film 104 formed above substrate 102. IDT electrode 103A includes electrode fingers 103 that excite a Rayleigh wave as a main acoustic wave. Dielectric film 104 covers electrode fingers 103 of IDT electrode 103A.

Dielectric film 104 is made of silicon oxide. The temperature coefficient of frequency (TCF) of silicon oxide has a sign opposite to that of piezoelectric substrate 102, so that dielectric film 104 made of silicon oxide may improve the TCF of acoustic wave device 101. Conventional acoustic wave device 101 may provide electrode fingers 103 with corrosion.

FIG. 23A is a schematic cross-sectional view of another conventional acoustic wave device 601 disclosed in International Publication No. 2012/102131. Acoustic wave device 601 includes piezoelectric substrate 604, IDT electrodes 602A, and dielectric film 603. IDT electrode 602A is formed on an upper surface of substrate 604, and includes electrode fingers 602 that excite a Rayleigh wave as a main acoustic wave having a wavelength λ. Dielectric film 603 is provided on the upper surface of piezoelectric substrate 604 for covering IDT electrode 602A, and is formed by a sputtering method or a CVD method.

FIG. 23B is an enlarged cross-sectional view of electrode finger 602. Electrode finger 602 includes upper layer 606 and lower layer 605. Angle 607 formed by a side surface and a bottom surface of lower layer 605 is about 90 degrees.

FIG. 23C is an enlarged cross-sectional view of another electrode finger 608 of IDT electrode 602A of acoustic wave device 601. Electrode finger 608 includes upper layer 611 and lower layer 612. Angle 609 formed by a side surface and a bottom surface of lower layer 612 is an acute angle. In other words, electrode finger 608 having a tapered shape.

The shapes of electrode fingers 602 and 608 are formed by a lift-off method employing a photolithography technique, or by an etching method employing a micro-process technique. Conventional acoustic wave device 601 may have a small reflectivity.

SUMMARY

An acoustic wave device includes a piezoelectric substrate, an IDT electrode including plural electrode fingers disposed above an upper surface of the piezoelectric substrate, a first dielectric film made of oxide disposed above the upper surface of the substrate for covering the electrode fingers, and a second dielectric film made of non-oxide disposed on upper surfaces of the electrode fingers and between the first dielectric film and each of the electrode fingers. The first dielectric film contacts the upper surface of the piezoelectric substrate between electrode fingers out of the plural electrode fingers adjacent to each other.

The acoustic wave device prevents the electrode fingers of the IDT electrode from corrosion.

DETAIL DESCRIPTION OF PREFERRED EMBODIMENTS

Exemplary Embodiment 1

Figure 1A:
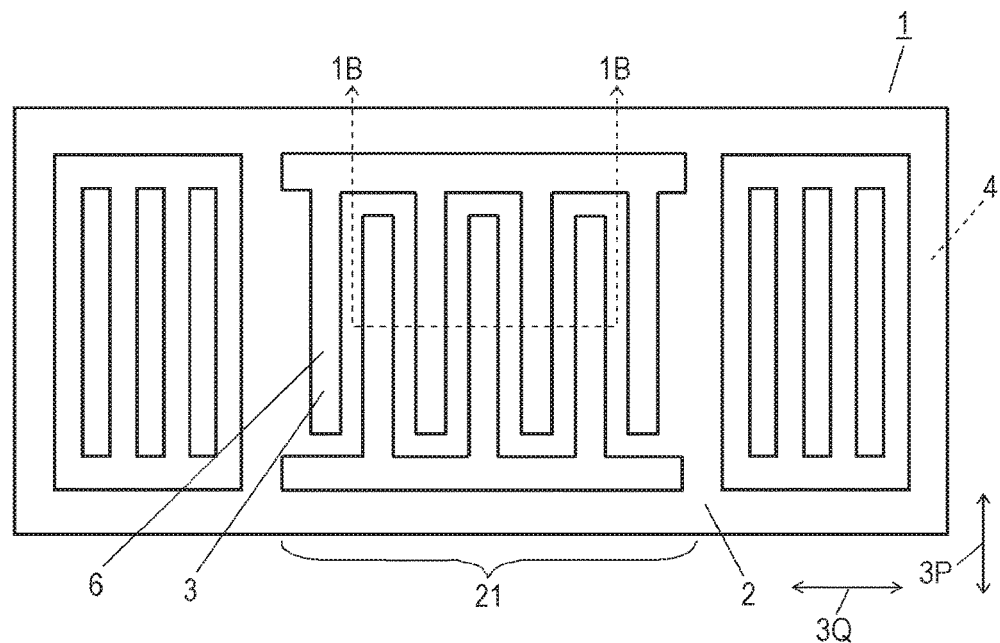
FIG. 1A is a schematic top view of an acoustic wave device in accordance with Exemplary Embodiment 1 of the present invention.
Figure 1B:
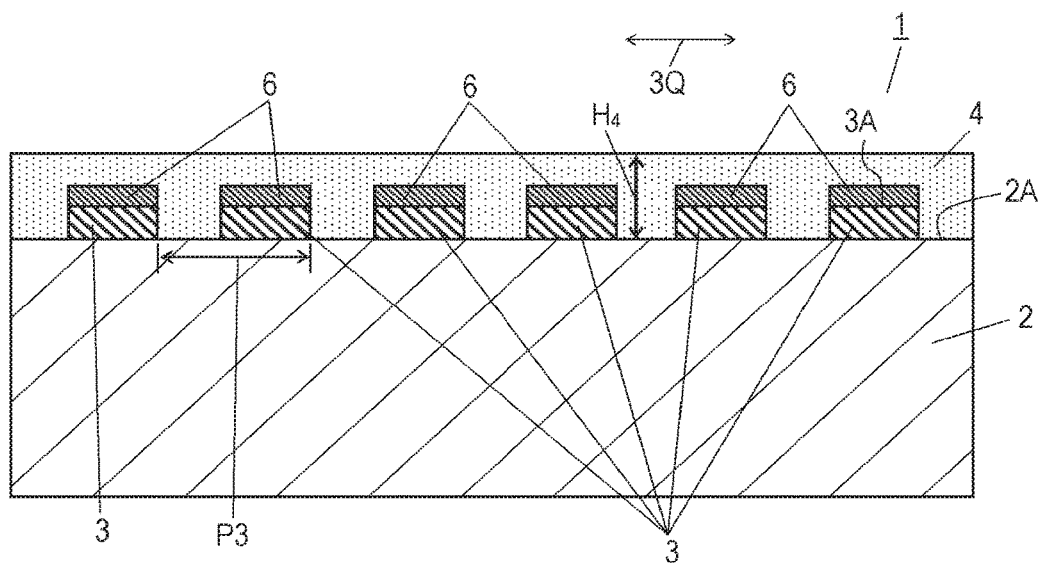
FIG. 1B is a schematic cross-sectional view of the acoustic wave device at line 1B-1B shown in FIG. 1A.

FIG. 1A is a schematic top view of acoustic wave device 1 in accordance with Exemplary Embodiment 1 of the present invention. FIG. 1B is a schematic cross-sectional view of acoustic wave device 1 at line 1B-1B shown in FIG. 1A. Acoustic wave device 1 includes interdigital transducer (IDT) electrode 21 including plural electrode fingers 3. FIG. 1B shows a cross section of device 1 along direction 3Q perpendicular to extension direction 3P in which electrode fingers 3 extend.

Acoustic wave device 1 includes piezoelectric substrate 2, IDT electrode 21 including plural electrode fingers 3 disposed on upper surface 2A of piezoelectric substrate 2, dielectric film 4 disposed above upper surface 2A of substrate 2 to cover plural electrode fingers 3, and dielectric film 6 disposed on upper surfaces 3A of plural electrode fingers 3 and between dielectric film 4 and each of electrode fingers 3. Electrode fingers 3 are configured to excite a surface wave, such as Rayleigh wave, as a main acoustic wave. Dielectric film 4 is made of oxide while dielectric film 6 is made of non-oxide. Dielectric film 4 contacts upper surface 2A of piezoelectric substrate 2 at positions between electrode fingers 3 adjacent to each other.

Figure 22:
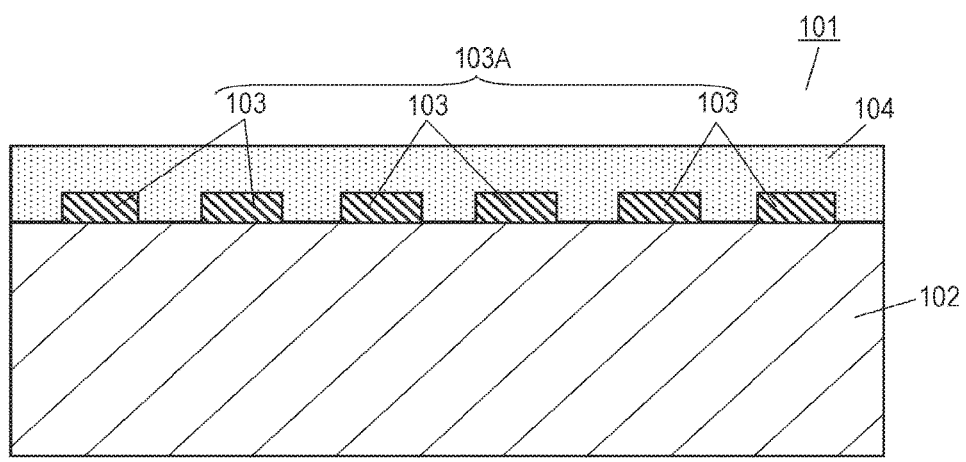
FIG. 22 is a schematic cross-sectional view of a conventional acoustic wave device.

Conventional acoustic wave device 101 shown in FIG. 22 includes dielectric film 104 made of oxide. When dielectric film 104 is formed on electrode fingers 103, this oxide may provide electrode fingers 103 with corrosion.

Acoustic wave device 1 includes dielectric film 6 made of non-oxide and disposed on upper surfaces 3A of electrode fingers 3, thereby preventing electrode fingers 3 from being oxidized or corroding due to dielectric film 4 disposed above upper surfaces 3A of electrode fingers 3.

In acoustic wave device 1 in accordance with Embodiment 1, dielectric film 4 contacts piezoelectric substrate 2 at positions between electrode fingers 3 adjacent to each other. This structure prevents variation in frequency of the main acoustic wave caused by dielectric film 6, and prevents the characteristics of acoustic wave device 1 from degrading caused by the frequency variation.

Piezoelectric substrate 2 allows, for instance, a Rayleigh wave to propagate through piezoelectric substrate 2 as the main acoustic wave; however, piezoelectric substrate 2 may allow other acoustic waves, such as a Shear Horizontal (SH) wave or a bulk wave as the main acoustic wave, to propagate through piezoelectric substrate 2. The effect on the frequency variation obtained by dielectric film 4 contacting substrate 2 at the positions between electrode fingers 3 can be produced remarkably in the case that piezoelectric substrate 2 allows the Rayleigh wave to propagate through piezoelectric substrate 2 as the main acoustic wave.

Characteristics of acoustic wave device 1 in accordance with Embodiment 1 will be demonstrated below. A sample of acoustic wave device 1 is prepared. In this sample, piezoelectric substrate 2 is made of a lithium niobate (LiNbO$_3$)-based substrate having cut angles and a propagation direction of the main acoustic wave expressed as an Euler angle) $(\varphi,\theta,\psi)=(0°,38°,0°)$. In this context, angles $\varphi$ and $\theta$ represent the cut angle of piezoelectric substrate 2, and angle $\psi$ represents the propagation direction of the main acoustic wave exited by IDT electrode 21. Electrode fingers 3 of IDT electrode 21 are arranged at pitches P3 each of which is a half of wavelength $\lambda$ of the main acoustic wave. Pitches P3 of this sample are 2 μm. IDT electrode 21 is made of molybdenum. A distance from a lower surface of electrode finger 3 to upper surface 3A, namely a film thickness of electrode finger 3 is 0.055$\lambda$. Dielectric film 4 is made of silicon dioxide (SiO$_2$). A height from upper surface 2A of piezoelectric substrate 2 to an upper surface of dielectric film 4, namely film thickness H$_4$ of dielectric film 4 is 0.3$\lambda$. Dielectric film 6 is made of silicon nitride (SiN).

Figure 2:
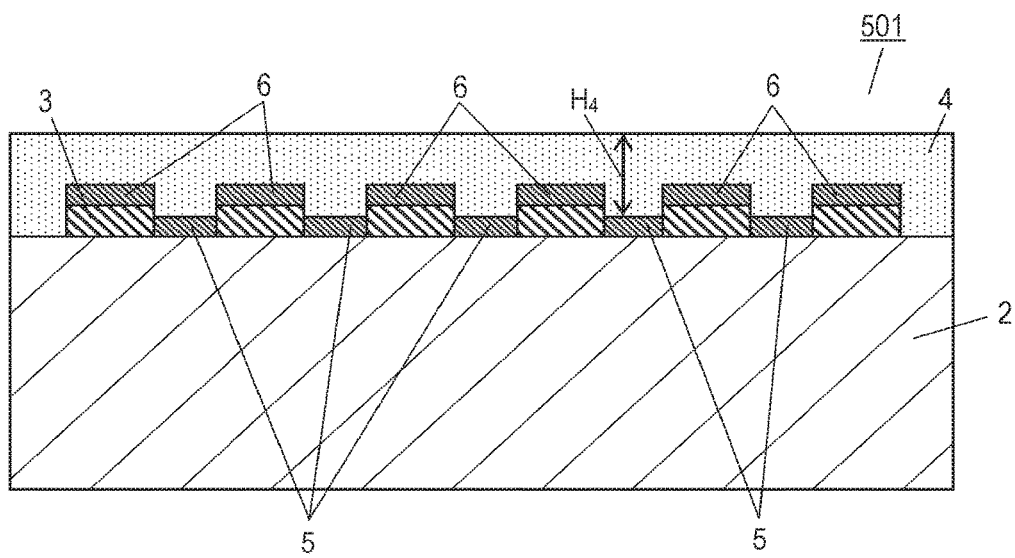
FIG. 2 is a schematic cross-sectional view of Comparative Example 1 of an acoustic wave device.

FIG. 2 is a cross-sectional view of Comparative Example 1, namely, acoustic wave device 501. In FIG. 2, components identical to those of acoustic wave device 1 shown in FIGS. 1A and 1B are denoted by the same reference numerals. Acoustic wave device 501 further includes dielectric film 5 made of SiN disposed between electrode fingers 3 adjacent to each other and between piezoelectric substrate 2 and dielectric film 4. Film thickness H$_4$ of dielectric film 4 is a height from the upper surface of dielectric film 4 to a boundary between dielectric films 4 and 5. Conditions other than this are the same as acoustic wave device 1 shown in FIGS. 1A and 1B.

Figure 3:
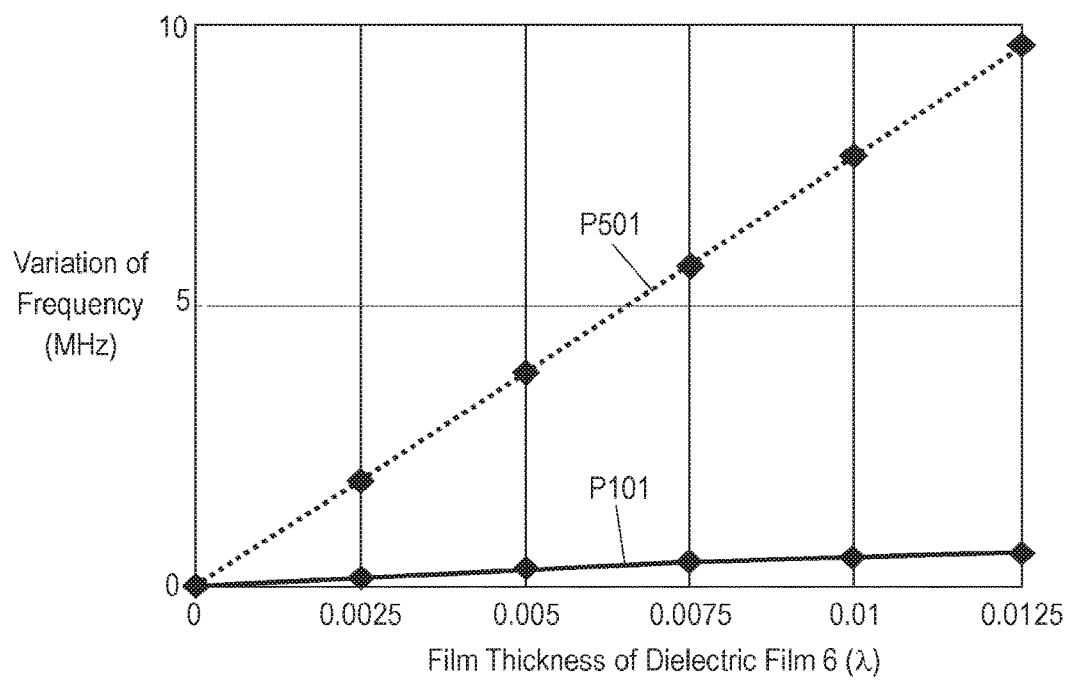
FIG. 3 shows characteristics of the acoustic wave device in accordance with Embodiment 1.

FIG. 3 shows profile P101 of an amount of change in frequency of the main acoustic wave of acoustic wave device 1 in accordance with Embodiment 1 and profile P501 of that of Comparison Example 1, namely, acoustic wave device 501. In FIG. 3, the vertical axis represents the amount of change in frequency of the main acoustic wave, and the horizontal axis represents a film thickness of dielectric film 6. To be more specific, profiles P101 and P501 shown in FIG. 3 represent the amount of change in the frequency of main acoustic wave from a reference acoustic wave device including none of dielectric films 5 and 6. Acoustic wave device 1 does not include dielectric film 5 between electrode fingers 3 adjacent to each other and between piezoelectric substrate 2 and dielectric film 4, and has dielectric film 4 contact upper surface 2A of substrate 2. As shown in FIG. 3, in the case that piezoelectric substrate 2 is a substrate that propagates a Rayleigh wave as a main acoustic wave, acoustic wave device 1 in accordance with Embodiment 1 suppresses the frequency change of the main acoustic wave comparing with acoustic wave device 501 of Comparative Example 1.

In the case that piezoelectric substrate 2 is a substrate that propagates a Rayleigh wave as the main acoustic wave, piezoelectric substrate 2 is made of a lithium niobate (LiNbO$_3$)-based substrate having cut angles and a propagation direction of the main acoustic wave expressed as an Euler angle $(\varphi,\theta,\psi)$ satisfying: $-10°\leq\varphi\leq10°$, $33°\leq\theta\leq43°$, and $-10°\leq\psi\leq10°$. Piezoelectric substrate 2 may be a quartz-based substrate having cut angles and a propagation direction of the main acoustic wave expressed as Euler angle (φ,θ,ψ) satisfying: $-1° \leq \varphi \leq 1°$, $113° \leq \theta \leq 135°$, and $-5° \leq \psi \leq 5°$. Piezoelectric substrate 2 may be a lithium tantalite (LiTaO$_3$)-based substrate having cut angles and a propagation direction of the main acoustic wave expressed as Euler angle (φ,θ,ψ) satisfying $-7.5° \geq \varphi \leq 2.5°$, $111° \leq \theta \leq 121°$, and $-2.5° \leq \psi \leq 7.5°$.

Piezoelectric substrate 2 may be made of a piezoelectric medium other than the above substrates, such as the quartz-based substrate, the lithium niobate (LiNbO$_3$)-based substrate, or the lithium tantalite (LiTaO$_3$)-based substrate, or a thin film as long as the medium satisfies an Euler angle other than the above Euler angles. In this context, angles φ and θ represent the cut-angles of piezoelectric substrate 2, and angle ψ represents the propagation direction of the main acoustic wave. For instance, piezoelectric substrate 2 may be a lithium niobate substrate that propagates an SH wave or a Love wave and has a rotation Y-cut of $-25°$ to $+25°$, or a lithium tantalite substrate that propagates an SH wave or a Love wave and has rotation Y-cut of 25° to 50°.

As shown in FIG. 1A, IDT electrode 21 is disposed on upper surface 2A of piezoelectric substrate 2 and includes a pair of comb-shaped electrodes each of which includes plural electrode fingers 3 interdigitating with each other viewed above acoustic wave device 1, and constitutes a resonator. Each of electrode fingers 3 is made of single metal, such as aluminum, copper, silver, gold, titanium, tungsten, molybdenum, platinum, or chrome, or an alloy mainly made of at least one of these metals, or a laminated structure of these metals. In the case that electrode finger 3 of IDT electrode 21 has the laminated structure, for instance, electrode finger 3 includes a Mo electrode layer mainly made of molybdenum and an Al electrode layer mainly made of aluminum disposed on the Mo electrode layer. The Mo electrode layer is thus located closer to upper surface 2A of piezoelectric substrate 2 than the Al electrode layer is. The Mo electrode layer has a higher density than the Al layer, hence confining the main acoustic wave at the surface of acoustic wave device 1 and reducing a resistance of electrode fingers 3 due to the Al electrode layer. The Mo electrode layer may contain an additive, such as silicon, and the Al electrode layer can contain an additive, such as magnesium, copper, or silicon. These additives mixtures increase withstanding electric-power properties of electrode fingers 3 of IDT electrode 21.

A total film thickness of electrode finger 3 expressed by where a total density Db of electrode finger 3 and a density Da of aluminum is preferably not smaller than $0.05\lambda \times Db/Da$ and not larger than $0.15\lambda \times Db/Da$. This condition allows the main acoustic wave to concentrate at the surface of acoustic wave device 1.

Dielectric film 4 is an inorganic insulating film made of oxide, and may be made of any medium allowing a transverse wave to propagate through the medium at a speed lower than a speed of a Rayleigh wave excited by comb-shaped electrode 3. For instance, dielectric film 4 is made of the medium mainly containing silicon dioxide (SiO$_2$). SiO$_2$ has a temperature coefficient of frequency (TCF) having a sign opposite to that of piezoelectric substrate 2. Dielectric film 4 made of SiO$_2$ improves the frequency-temperature characteristics of acoustic wave device 1.

In the case that dielectric film 4 is made of SiO$_2$, the film thickness is determined such that an absolute value of an amount of change in frequency of the main acoustic wave excited by electrode fingers 3 of IDT electrode 21 with respect to a temperature is not larger than a predetermined value (40 ppm/° C.). According to Embodiment 1, the film thickness of dielectric film 4 is a distance from the upper surface of dielectric film 4 to a boundary between upper surface 2A of substrate 2 and dielectric film 4 disposed between finger electrodes 3 adjacent to each other of the IDT electrode. The thickness of dielectric film 4 satisfying the above predetermined value and made of silicon dioxide is not smaller than $0.2\lambda$, and not larger than $0.5\lambda$.

Dielectric film 6 is an inorganic insulating film made of non-oxide. Dielectric film 6 prevents electrode fingers 3 from being oxidized or corroding when dielectric film 4 is formed above electrode fingers 3. Dielectric film 6, namely inorganic insulating film particularly made of nitride, such as silicon nitride, or carbide, such as silicon carbide, produce this effect remarkably. Dielectric film 6 is made of a medium allowing a transverse wave to propagate through the medium at a speed higher than a speed of the main acoustic wave excited by electrode fingers 3 of IDT electrode 21, or is made of a medium allowing a transverse wave to propagate the medium at a speed higher than a speed of a transverse wave propagating through dielectric film 4. The medium can be mainly made of, for instance, diamond, silicon nitride, silicon nitride oxide, aluminum nitride, or aluminum oxide.

Figure 4:
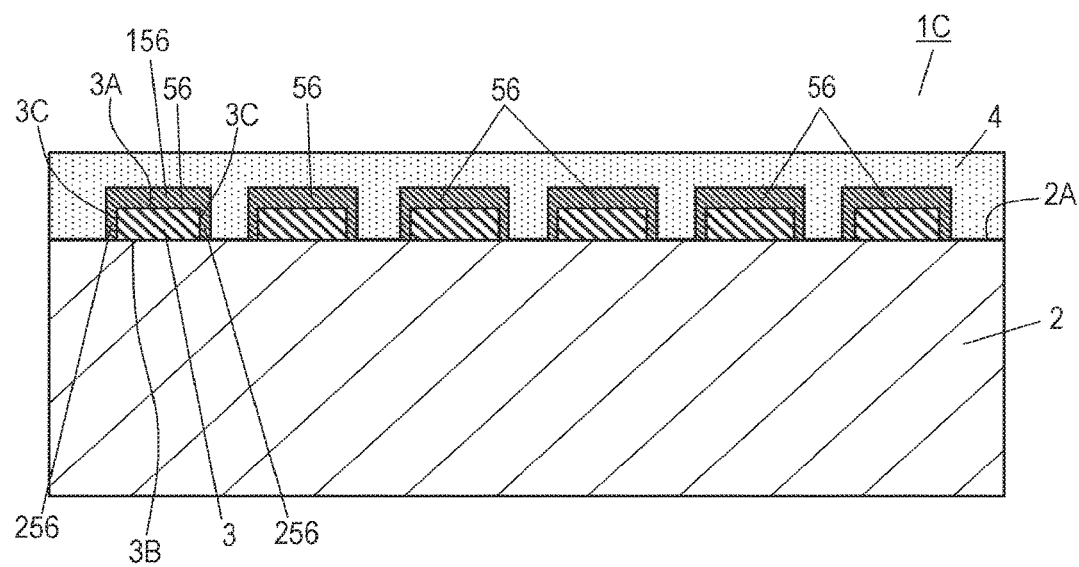
FIG. 4 is a schematic cross-sectional view of another acoustic wave device in accordance with Embodiment 1.

FIG. 4 is a schematic cross-sectional view of another acoustic wave device 1C in accordance with Embodiment 1. In FIG. 4, components identical to those of acoustic wave device 1 shown in FIG. 1B are denoted by the same reference numerals. Acoustic wave device 1C includes dielectric film 56 instead of dielectric film 6 of acoustic wave device 1 shown in FIG. 1B. Dielectric film 56 is made of the same material as that of dielectric film 6. Each of electrode fingers 3 has lower surface 3B facing upper surface 2A of piezoelectric substrate 2, upper surface 3A opposite to lower surface 3B, and side surface 3C connected to upper surface 3A and lower surface 3B. Dielectric film 56 includes portion 156 disposed on upper surface 3A of each electrode finger 3 and portion 256 disposed on side surface 3C of each electrode finger 3. In other words, dielectric film 56 contacts side surface 3C of electrode finger 3. Portion 256 of dielectric film 56 extends downward from portion 156 to upper surface 2A of piezoelectric substrate 2 as not to expose side surface 3C. This structure allows dielectric film 56 to protect electrode finger 3 more effectively, thereby preventing electrode finger 3 from being oxidized.

A film thickness of portion 156 of dielectric film 56 disposed on upper surface 3A of electrode finger 3 is preferably larger than that of portion 256 disposed on side surface 3C of electrode finger 3. This structure allows dielectric film 56 to protect electrode finger 3 effectively, and to suppress effectively the frequency variation of the main acoustic wave.

Figure 5:
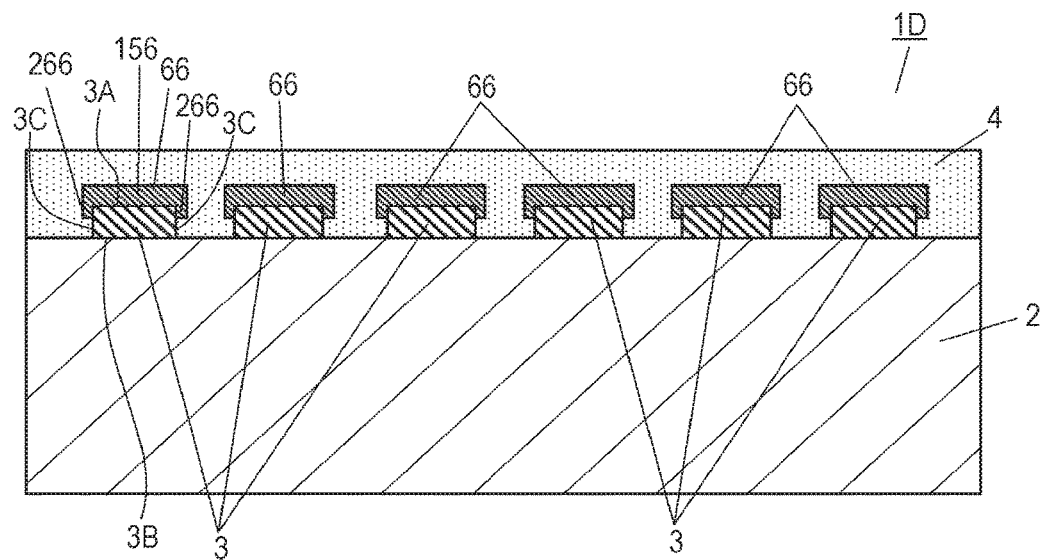
FIG. 5 is a schematic cross-sectional view of still another acoustic wave device in accordance with Embodiment 1.

FIG. 5 is a schematic cross-sectional view of still another acoustic wave device 1D in accordance with Embodiment 1. In FIG. 5 components identical to those of acoustic wave device 1C shown in FIG. 4 are denoted by the same reference numerals. Acoustic wave device 1D includes dielectric film 66 instead of dielectric film 56 of acoustic wave device 1C shown in FIG. 4. Dielectric film 66 is made of the same material as that of dielectric film 56. Dielectric film 66 includes portion 266 instead of portion 256 of dielectric film 56. Portion 266 is disposed on side surface 3C such that a part of side surface 3C is exposed from portion 266. Portion 266 of dielectric film 66 extends downward from portion 156 to partially cover side surface 3C, but does not reach upper surface 2A of piezoelectric substrate 2. Portion 266 is thus located away from upper surface 2A. This structure allows dielectric film 66 to suppress more effectively the frequency variation of the main acoustic wave, and to prevent electrode finger 3 from being oxidized.

Figure 6A:
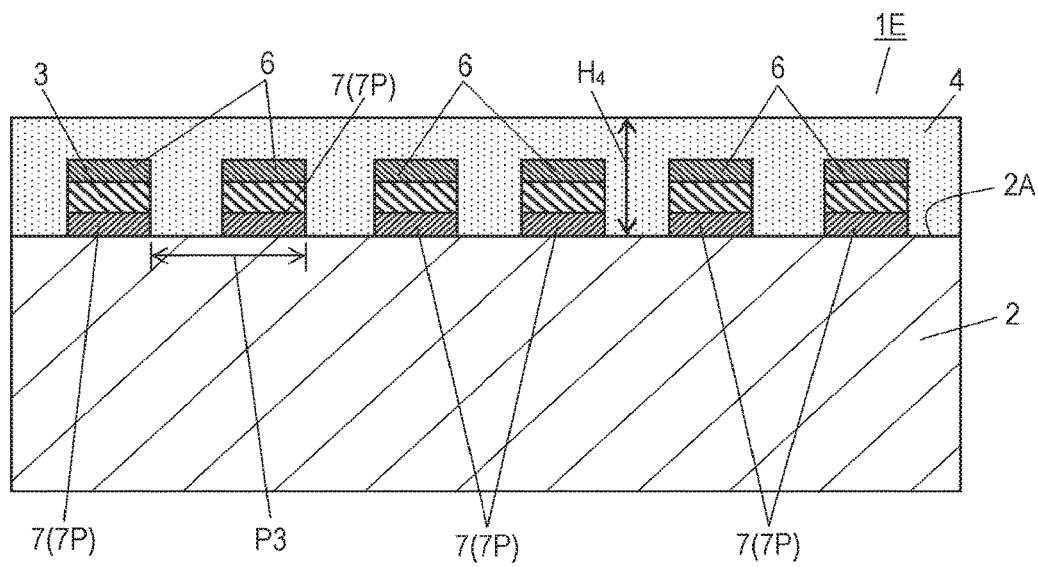
FIG. 6A is a schematic cross-sectional view of a further acoustic wave device in accordance with Embodiment 1.

FIG. 6A is a schematic cross-sectional view of further acoustic wave device 1E in accordance with Embodiment 1. In FIG. 6A, components identical to those of acoustic wave device 1 shown in FIG. 1B are denoted by the same reference numerals. Acoustic wave device 1E further includes dielectric film 7 including plural portions 7P disposed between upper surface 2A of the piezoelectric substrate and respective ones of lower surfaces 3B of electrode fingers 3. Dielectric film 7 is disposed on upper surface 2A of piezoelectric substrate 2. Each of electrode fingers 3 is disposed on respective one of upper surfaces of portions 7P of dielectric film 7. Dielectric film 7 is made of medium allowing a transverse wave to propagate through the medium at a speed higher than a speed of the main acoustic wave propagating through piezoelectric substrate 2. This structure allows an electromechanical coupling coefficient of acoustic wave device 1E to be adjusted more precisely while reducing a loss caused by dielectric film 7. Acoustic wave device 1E thus can be used in a filter that has a pass bandwidth appropriate for a communication system, such as portable phones. In this case, if piezoelectric substrate 2 is made of a quartz-based substrate, a lithium niobate ($LiNbO_3$)-based substrate, a lithium tantalite ($LiTaO_3$)-based substrate, or a potassium niobate ($KNbO_3$)-based substrate, dielectric film 7 is preferably made of dielectric material, such as aluminum oxide ($Al_2O_3$), diamond, silicon nitride, silicon nitride oxide, aluminum nitride, or titanium nitride.

A dielectric constant of dielectric film 7 is smaller than that of piezoelectric substrate 2, hence allowing an electromechanical coupling coefficient of acoustic wave device 1E to be adjusted precisely. Acoustic wave device 1E thus can be used in a filter that has a pass bandwidth appropriate for a communication system, such as portable phones. In this case, if piezoelectric substrate 2 is made of a lithium niobate ($LiNbO_3$)-based substrate, a lithium tantalite ($LiTaO_3$)-based substrate, or a potassium niobate ($KNbO_3$)-based substrate, dielectric film 7 is preferably made of dielectric material, such as aluminum oxide ($Al_2O_3$), diamond, silicon nitride, silicon nitride oxide, or aluminum nitride.

A speed of a transverse wave propagating through dielectric film 7 ($Al_2O_3$) is higher than the speed of an acoustic wave (e.g. main acoustic wave) propagating through piezoelectric substrate 2. This arrangement allows an energy of the acoustic wave propagating through substrate 2 to concentrate at dielectric film 4 ($SiO_2$), and improves the temperature characteristics of a resonator constituted by acoustic wave device 1E.

Figure 6B:
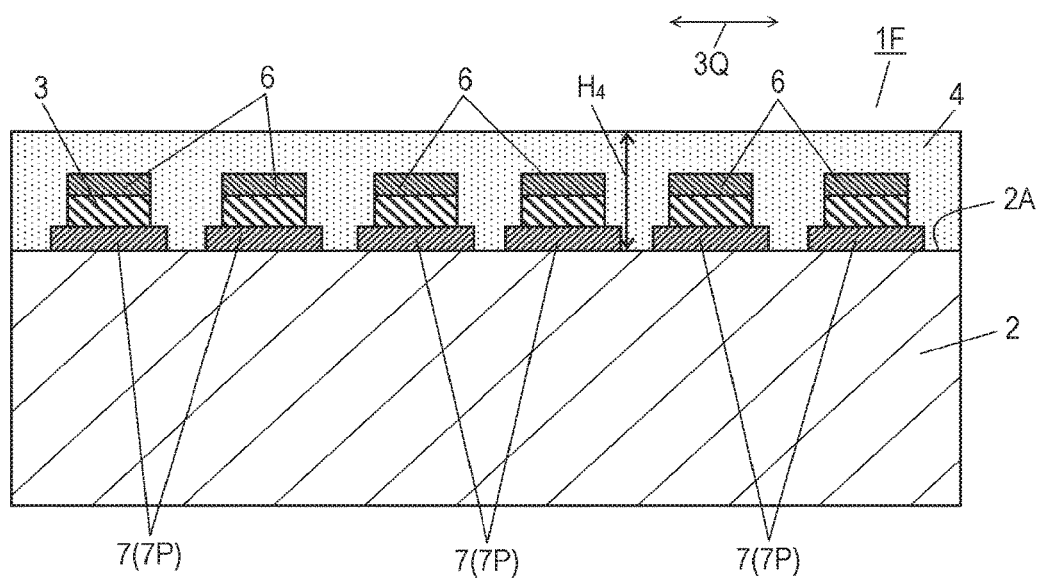
FIG. 6B is a schematic cross-sectional view of a further acoustic wave device in accordance with Embodiment 1.

FIG. 6B is a schematic cross-sectional view of further acoustic wave device 1F in accordance with Embodiment 1. In FIG. 6B components identical to those of acoustic wave device 1E shown in FIG. 6A are denoted by the same reference numerals. As shown in FIG. 1A, electrode fingers 3 extend along extension direction 3P and in parallel to upper surface 2A of piezoelectric substrate 2. In acoustic wave device 1F shown in FIG. 6B, portion 7P of dielectric film 7 has a width larger that of electrode finger 3 in direction 3Q perpendicular to extension direction 3P in which electrode fingers 3 extend. This structure allows an electromechanical coefficient of acoustic wave device 1F to be adjusted precisely.

Figure 7:
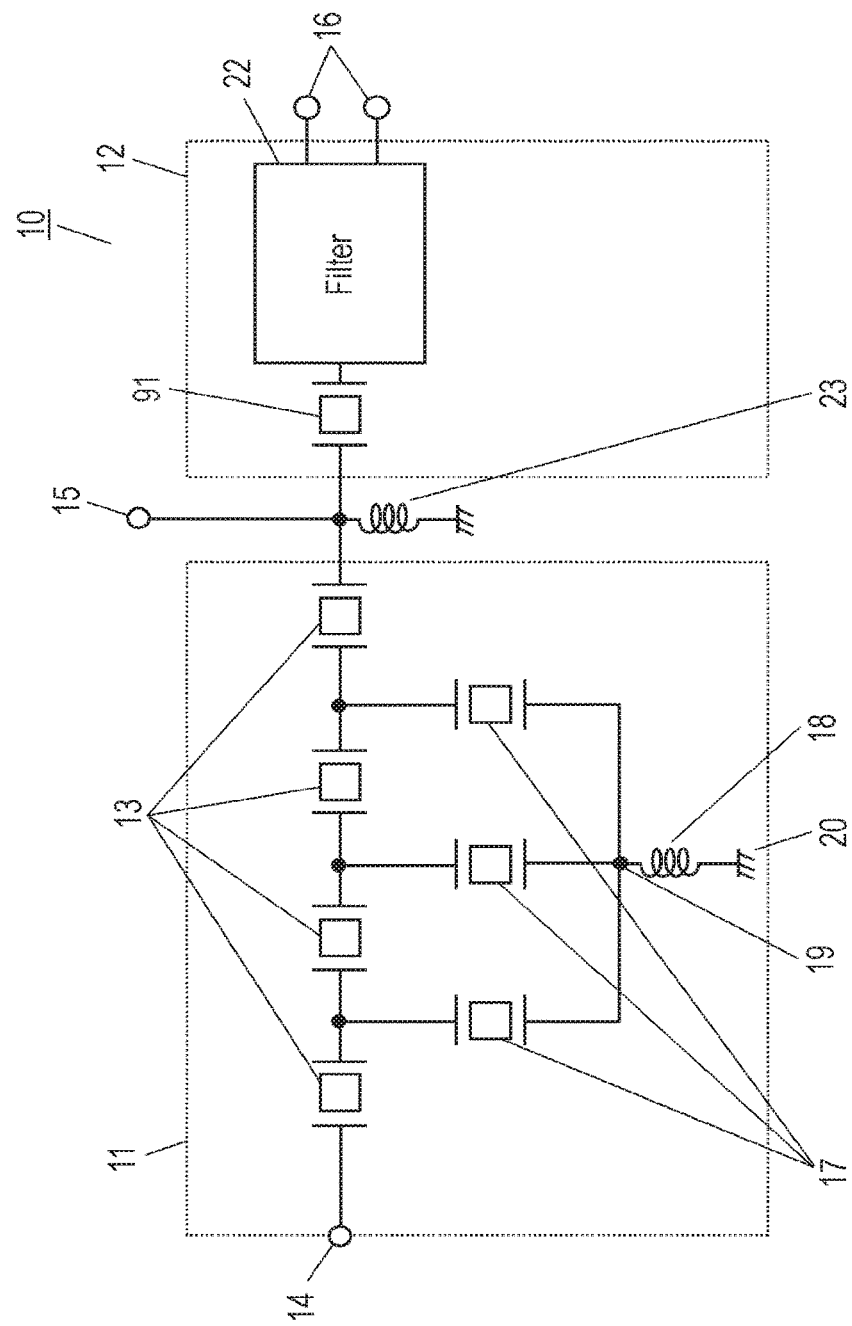
FIG. 7 is a block diagram of an antenna duplexer including the acoustic wave device in accordance with Embodiment 1.

FIG. 7 is a circuit block diagram of antenna duplexer 10 including acoustic wave device 1 (1C to 1F) in accordance with Embodiment 1. Antenna duplexer 10 includes filter 11 having a first pass-band and filter 12 having a second pass-band higher than the first pass-band.

In FIG. 7, antenna duplexer 10 acts as, for instance, an antenna duplexer for band 8 of the Universal Mobile Telecommunications System (UMTS). Filter 11 functions as a transmitting filter and has the first pass-band (from 880 MHz to 915 MHz). Filter 12 functions as a receiving filter and has the second pass-band (from 925 MHz to 960 MHz) having a lowest frequency higher than a highest frequency in the first pass-band. Filter 11 is connected between input terminal 14 and antenna terminal 15, and receives a transmission signal at input terminal 14 and outputs the signal from antenna terminal 15. Filter 11 includes plural series resonators 13, plural parallel resonators 17 having a resonant frequency lower than anti-resonant frequency of series resonators 13. Series resonators 13 and parallel resonators 17 are connected in a ladder shape. Ground 20 of parallel resonators 17 is connected to ground terminal 19. Filter 11 further includes inductor 18 connected between ground terminal 19 and ground terminal 20.

Filter 12 includes resonator 91 and filter 22 both connected between antenna terminal 15 and output terminals 16 as balanced terminals. Filter 12 receives a signal at antenna terminal 15 and outputs the received signal from output terminals 16. Filter 22 is a vertical-mode coupling type filter.

Antenna duplexer 10 further includes phase shifter 23 connected between filters 11 and 12. Phase shifter 23 has low impedance in one of the first pass-band and the second pass-band, and high impedance in another of the first pass-band and the second pass-band, thereby improving isolation between filters 11 and 12.

Acoustic wave device 1 (1C to 1F) in accordance with Embodiment 1 used in filter 11 or 12 prevents corrosion of electrode fingers of the IDT electrode of antenna duplexer 10, and also prevent deterioration of characteristics of antenna duplexer 10 caused by a frequency variation of main acoustic waves in filters 11 and 12.

Figure 8:
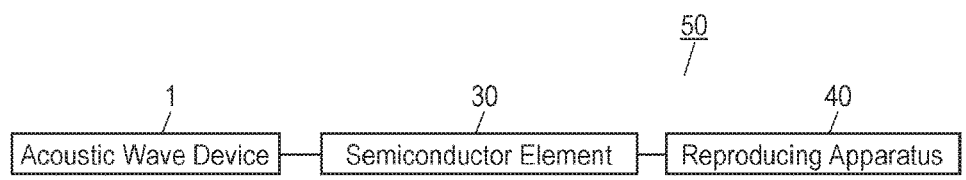
FIG. 8 is a block diagram of an electronic apparatus including the acoustic wave device in accordance with Embodiment 1.

FIG. 8 is a block diagram of electronic apparatus 50, such as a portable phone, including acoustic wave device 1 (1C to 1F) in accordance with Embodiment 1. Electronic apparatus 50 includes acoustic wave device 1 (1C to 1F), semiconductor device 30 connected to acoustic wave device 1, and reproducing apparatus 40 connected to semiconductor device 30. Reproducing apparatus 40 includes a display, such as a liquid crystal display, and an audio reproducer, such as a loudspeaker.

Acoustic wave device 1 (1C to 1F) in accordance with Embodiment 1 used in electronic apparatus 50 improves communication quality of apparatus 50.

Exemplary Embodiment 2

Figure 9:
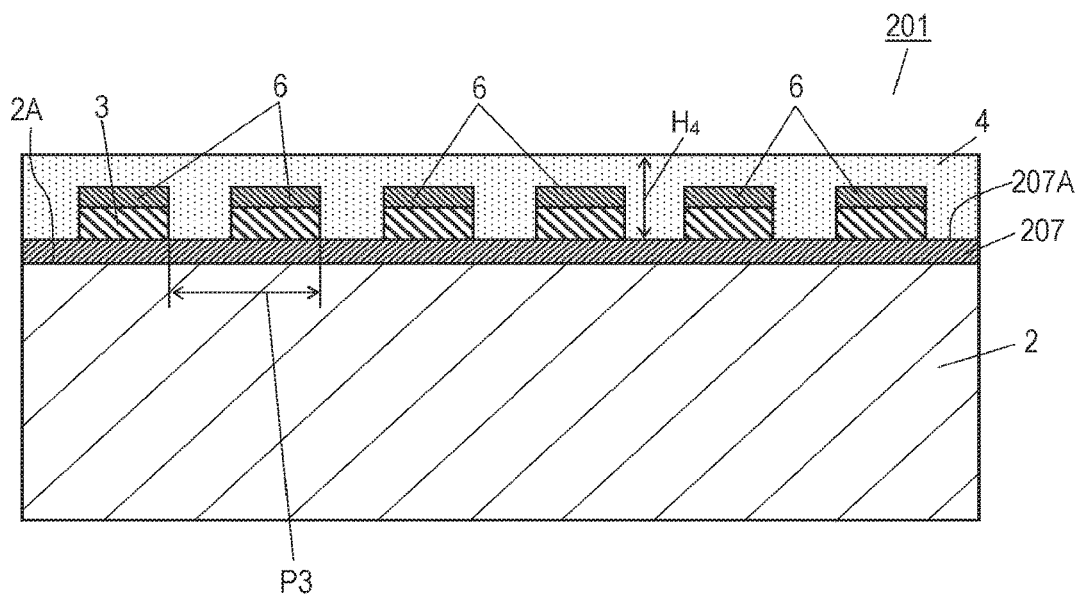
FIG. 9 is a schematic cross-sectional view of an acoustic wave device in accordance with Exemplary Embodiment 2 of the invention.

FIG. 9 is a schematic cross-sectional view of acoustic wave device 201 in accordance with Exemplary Embodiment 2 of the present invention. In FIG. 9, components identical to those of acoustic wave device 1 in accordance with Embodiment 1 shown in FIGS. 1A and 1B are denoted by the same reference numerals.

Acoustic wave device 201 further includes dielectric film 207 disposed between piezoelectric substrate 2 and each of plural electrode fingers 3. To be more specific, dielectric film 207 is disposed on upper surface 2A of piezoelectric substrate 2 while plural electrode fingers 3 are disposed on upper surface 207A of dielectric film 207. Dielectric film 207 is made of medium allowing a transverse wave to propagate through the medium at a speed higher than that of a main acoustic wave propagating through piezoelectric substrate 2. This structure allows an electromechanical coefficient of acoustic wave device 201 to be adjusted precisely while reducing a loss caused by dielectric film 207, hence providing a filter having a pass bandwidth appropriate for a communication system, such as portable phones.

Dielectric film 4 adjoins upper surface 207A of dielectric film 207 at positions between electrode fingers 3 adjacent to each other.

In acoustic wave device 201, dielectric film 6 made of non-oxide prevents corrosion or oxidation of electrode fingers 3, similarly to acoustic wave device 1 according to Embodiment 1.

In acoustic wave device 201, dielectric film 4 disposed between electrode fingers 3 adjacent to each other contacts upper surface 207A of dielectric film 207. This structure suppresses the frequency variation, caused by the presence of dielectric film 6, in the main acoustic wave, thus preventing deterioration of characteristics caused by this frequency variation of acoustic wave device 201.

Piezoelectric substrate 2 allows a Rayleigh wave to propagate through piezoelectric substrate 2 as the main acoustic wave; however, piezoelectric substrate 2 can be a piezoelectric substrate allowing another acoustic wave, such as a Shear Horizontal (SH) wave or a bulk wave, to propagate as the main acoustic wave. The frequency variation of the main acoustic wave can be remarkably reduced by the structure in which dielectric film 4 contacts dielectric film 207 at positions between electrode fingers 3 particularly in the case that piezoelectric substrate 2 allows a Rayleigh wave to propagate through piezoelectric substrate 2 as the main acoustic wave.

Dielectric film 207 is made of medium allowing a transverse wave propagates at a speed higher than that of the main acoustic wave propagating through piezoelectric substrate 2. This structure allows an electromechanical coefficient of acoustic wave device 201 to be adjusted precisely while reducing a loss caused by dielectric film 207, thus providing a filter having a pass bandwidth appropriate for a communication system, such as portable phones. In the case that piezoelectric substrate 2 is made of a quartz-based substrate, a lithium niobate ($LiNbO_3$)-based substrate, a lithium tantalite ($LiTaO_3$)-based substrate, or a potassium niobate ($KNbO_3$)-based substrate, dielectric film 207 is preferably made of dielectric material, such as aluminum oxide ($Al_2O_3$), diamond, silicon nitride, silicon nitride oxide, aluminum nitride, or titanium nitride.

Dielectric film 207 may be made of medium having a dielectric constant smaller than that of piezoelectric substrate 2, thereby allowing an electromechanical coupling coefficient of acoustic wave device 201 to be adjusted precisely. Acoustic wave device 201 thus can be used in a filter that has a pass bandwidth appropriate for a communication system, such as portable phones. In the case that piezoelectric substrate 2 is made of a lithium niobate ($LiNbO_3$)-based substrate, a lithium tantalite ($LiTaO_3$)-based substrate, or a potassium niobate ($KNbO_3$)-based substrate, dielectric film 207 is preferably made of dielectric material, such as aluminum oxide ($Al_2O_3$), diamond, silicon nitride, silicon nitride oxide, or aluminum nitride.

Figure 10:
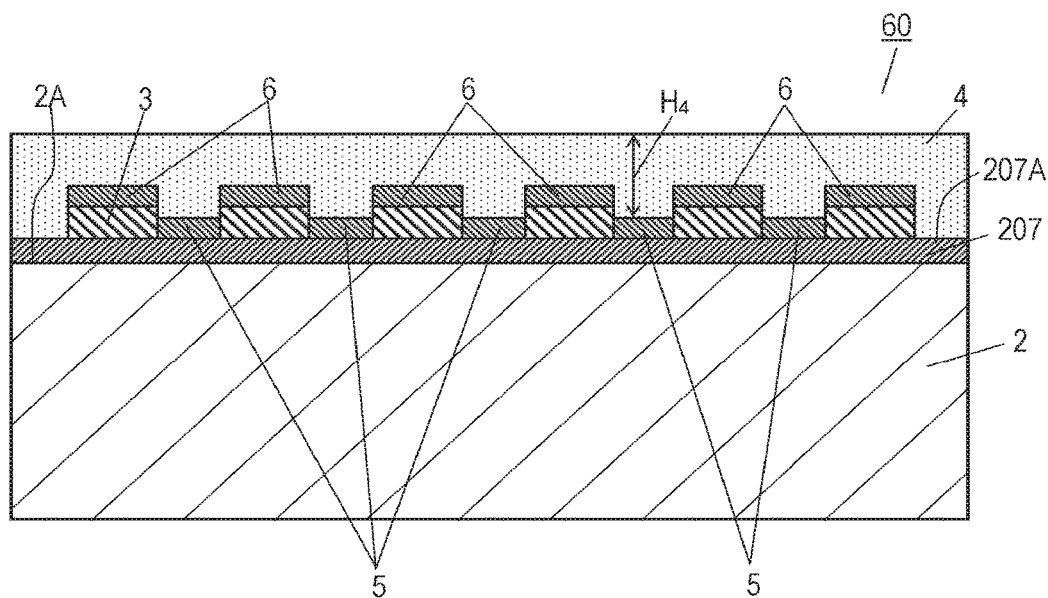
FIG. 10 is a schematic cross-sectional view of Comparative Example 2 of an acoustic wave device.

FIG. 10 is a schematic cross-sectional view of Comparative Example 2, acoustic wave device 60. In FIG. 10, components identical to those of acoustic wave device 201 in accordance with Embodiment 2 shown in FIG. 9 are denoted by the same reference numerals. Acoustic wave device 60 further includes dielectric film 5 made of non-oxide disposed on upper surface 207A of dielectric film 207 at positions between electrode fingers 3 adjacent to each other. Dielectric film 4 covers dielectric films 5 and 6.

Acoustic wave device 201 in accordance with Embodiment 2 prevents deterioration of characteristics caused by the frequency variation comparing to Comparison Example 2, acoustic wave device 60.

Figure 11:
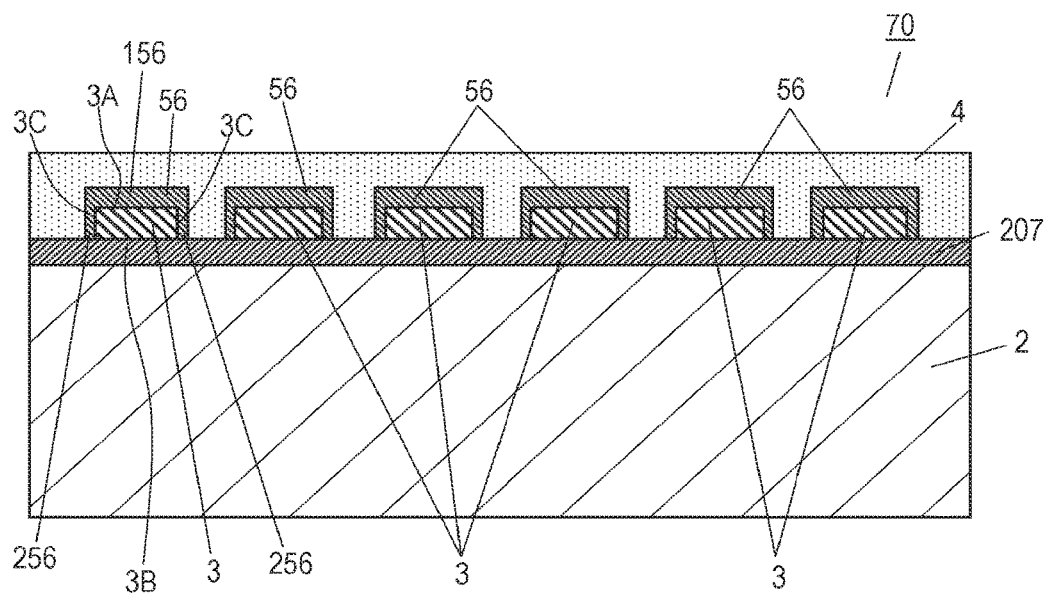
FIG. 11 is a schematic cross-sectional view of another acoustic wave device in accordance with Embodiment 2.

FIG. 11 is a schematic cross-sectional view of another acoustic wave device 70 in accordance with Embodiment 2. In FIG. 11, components identical to those of acoustic wave device 201 shown in FIG. 9 and acoustic wave device 1C in accordance with Embodiment 1 shown in FIG. 4 are dented by the same reference numerals. Acoustic wave device 70 includes dielectric film 56 instead of dielectric film 6, similarly to acoustic wave device 1C shown in FIG. 4. Dielectric film 56 has portions 156 disposed on upper surfaces 3A of electrode fingers 3 and portions 256 disposed on side surfaces 3C of electrode fingers 3. This structure increases protective effect of dielectric film 56 to electrode fingers 3, thereby preventing electrode fingers 3 from being oxidized.

A film thickness of portion 156 of dielectric film 56 disposed on upper surface 3A of electrode finger 3 is preferably larger than that of portion 256 disposed on side surface 3C of electrode finger 3. This structure allows dielectric film 56 to protect electrode finger 3 more effectively and yet, to prevent electrode fingers 3 from being oxidized as well as to prevent effectively the frequency variation of the main acoustic wave.

Figure 12:
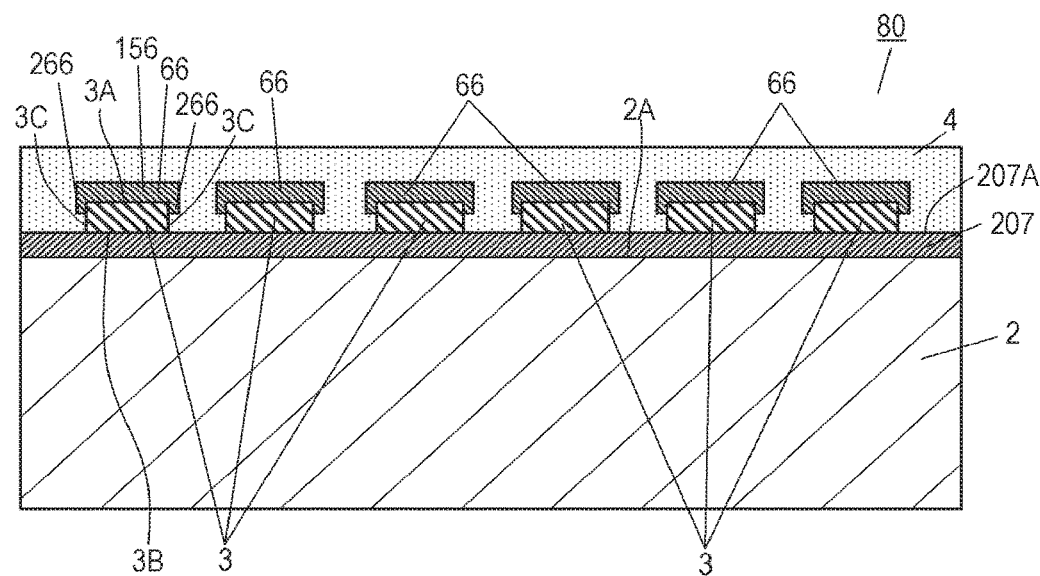
FIG. 12 is a schematic cross-sectional view of still another acoustic wave device in accordance with Embodiment 2.

FIG. 12 is a schematic cross-sectional view of still another acoustic wave device 80 in accordance with Embodiment 2. In FIG. 12, components identical to those of acoustic wave device 70 shown in FIG. 11 and acoustic wave device 1D in accordance with Embodiment 1 shown in FIG. 5 are denoted by the same reference numerals. Acoustic wave device 80 includes dielectric film 66 instead of dielectric film 56, similarly to acoustic wave device 1D shown in FIG. 5. Dielectric film 66 has portions 156 and portions 266. Portions 156 are disposed on upper surfaces 3A of electrode fingers 3. Portions 266 are disposed on side surfaces 3C of electrode fingers 3. Portion 266 exposes a part of side surface 3C of electrode finger 3. Dielectric film 66 reduces more effectively the frequency variation of the main acoustic wave, and prevents electrode fingers 3 from being oxidized.

Acoustic wave devices 70, 80, and 201 in accordance with Embodiment 2 may be employed in antenna duplexer 10 and electronic apparatus 50 shown in FIGS. 7 and 8, similarly to acoustic wave devices 1, and 1C to 1F in accordance with Embodiment 1. Acoustic wave devices 70, 80, and 201 provide effects similar to those of acoustic wave devices 1 and 1C to 1F.

Exemplary Embodiment 3

Figure 13A:
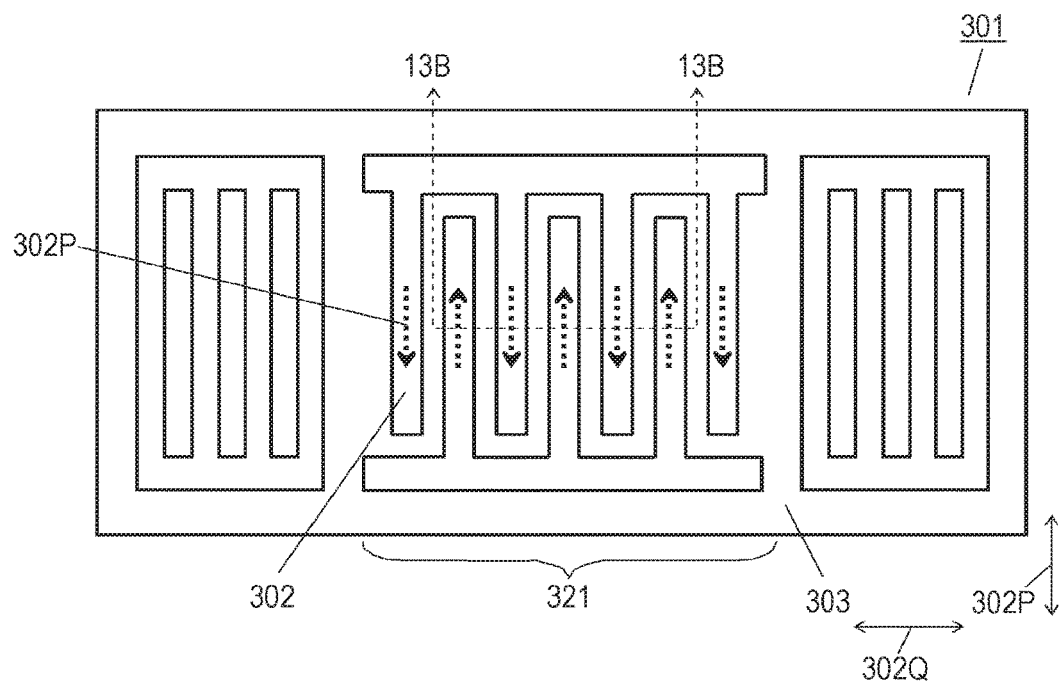
FIG. 13A is a schematic plan view of an acoustic wave device in accordance with Exemplary Embodiment 3 of the invention.
Figure 13B:
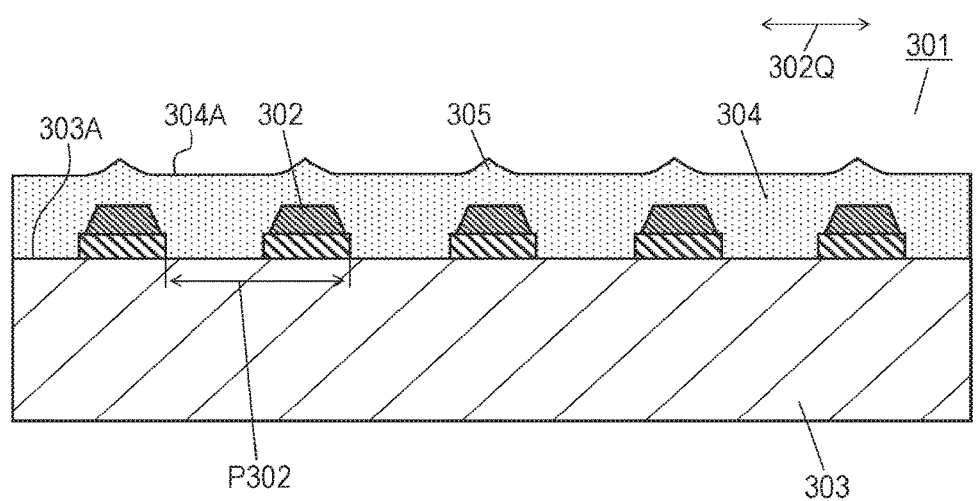
FIG. 13B is a schematic cross-sectional view of the acoustic wave device at line 13B-13B shown in FIG. 13A.

FIG. 13A is a schematic plan view of acoustic wave device 301 in accordance with Exemplary Embodiment 3 of the present invention. FIG. 13B is a cross-sectional view of acoustic wave device 301 at line 13B-13B shown in FIG. 13A. Acoustic wave device 301 includes piezoelectric substrate 303, interdigital transducer (IDT) electrode 321 disposed on upper surface 303A of piezoelectric substrate 303, and dielectric film 304 disposed above upper surface 303A of piezoelectric substrate 303 to cover IDT electrode 321. IDT electrode 321 includes plural electrode fingers 302 extending in extension direction 302P. IDT electrode 321 includes comb-shape electrodes facing each other and disposed on upper surface 303A. Dielectric film 304 covers upper surface 303A of piezoelectric substrate 303 and IDT electrode 321. Upper surface 304A of dielectric film 304 has projections 305 located above electrode fingers 302. Electrode fingers 302 extend in extension direction 302P parallel with upper surface 303A of substrate 303. A main acoustic wave propagates in propagation direction 302Q perpendicular to extension direction 302P.

Figure 14:
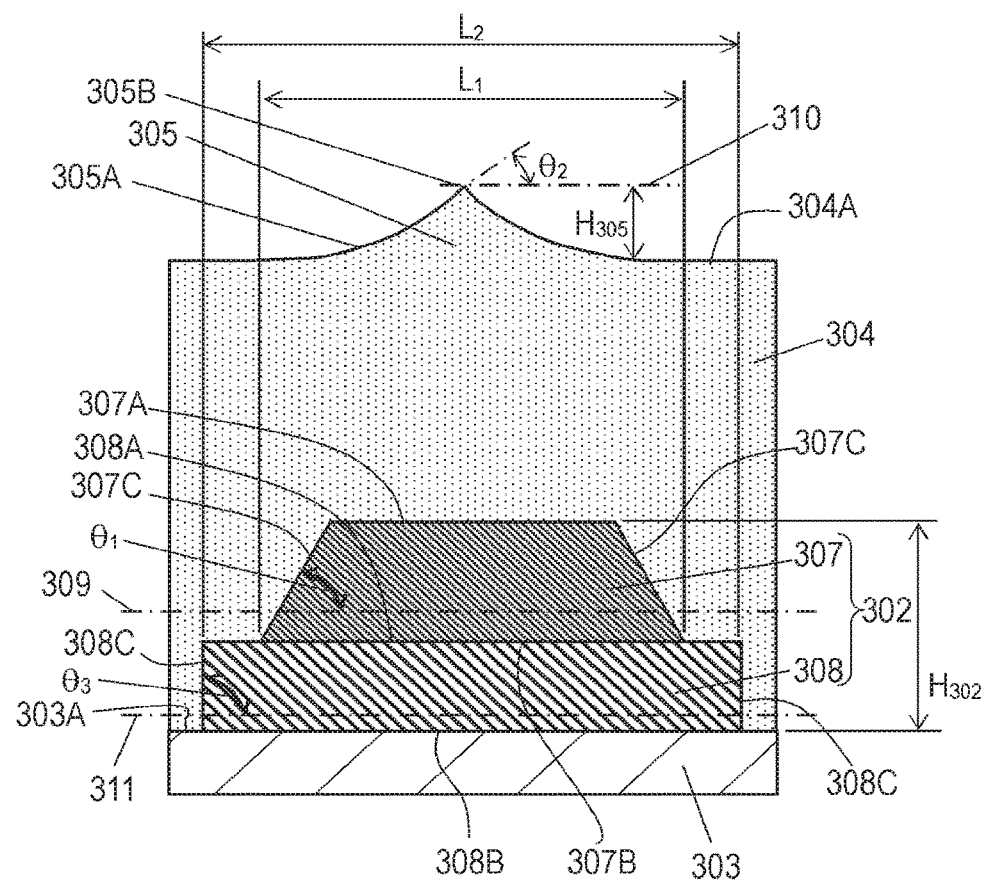
FIG. 14 is an enlarged cross-sectional view of the acoustic wave device in accordance with Embodiment 3.

FIG. 14 is an enlarged cross-sectional view of acoustic wave device 301 for schematically illustrating electrode finger 302 formed by stacking dielectric films 304.

Each of electrode fingers 302 includes electrode layer 308 disposed on upper surface 303A of substrate 303 and electrode layer 307 disposed on upper surface 308A of electrode layer 308. Electrode layer 308 has lower surface 308B facing upper surface 303A of piezoelectric substrate 303, and has side surface 308C connected to upper surface 308A and lower surface 308B. Electrode layer 307 has lower surface 307B facing upper surface 308A of electrode layer 308, upper surface 307A opposite to lower surface 307B, and side surface 307C connected to upper surface 307A and lower surface 307B. Angle $\theta_1$ formed by side surface 307C and plane 309 parallel to upper surface 303A of substrate 303 inside electrode layer 307 is an acute angle. In other words, side surface 307C faces upward. Angle $\theta_1$ of electrode layer 307 is larger than angle $\theta_2$ that is the largest angle among angles formed by upper surface 305A of projection 305 and plane 310 parallel to upper surface 303A of substrate 303.

Angle $\theta_1$ being an acute angle decreases projection 305 formed on dielectric film 304. Small projection 305 decreases angle $\theta_2$, and consequently, allows angle $\theta_1$ to be larger than angle $\theta_2$. Angle $\theta_1$ of electrode layer 307 is preferably close to 90 degrees to increase a reflectivity. Angle $\theta_1$ is thus preferably larger than angle $\theta_2$.

The above structure does not excessively decrease angle $\theta_1$ and thus, provides a certain reflectivity of the acoustic wave. This structure decreases projections 305 formed on upper surface 304A of dielectric film 304, and prevents the reflectivity from decreasing. As a result, the reflectivity of acoustic wave device 301 can be greater.

In acoustic wave device 301 having a Rayleigh wave propagating through as a main acoustic wave, projections 305 scatter the acoustic wave, thereby reducing a reflectivity and increasing an insertion loss. Smaller projections 305 improve the reflectivity.

Piezoelectric substrate 303 may be made of lithium niobate, lithium tantalite, lithium tetraborate, or quartz. Piezoelectric substrate 303 of acoustic wave device 301 having a Rayleigh wave propagating as the main acoustic wave is preferably made of a rotation Y-cut X-propagation substrate having an Euler angle $(\varphi,\theta,\psi)$ satisfying $-5°\leq\varphi\leq5°$, $-5°\leq\theta\leq5°$, and $-5°\leq\psi\leq5°$.

A cross section of upper surface 305A of projection 305 perpendicular to extension direction 302P is downward convex. This shape can be formed by laminating dielectric films 304 by a biased-sputtering method.

The downward convex shape of upper surface 305A of projection 305 reduces a volume of projection 305, and prevents the reflectivity of acoustic wave device 301 from decreasing. In the case that the cross section of upper surface 305A of projection 305 is downward convex, the largest angle $\theta_2$ among angles formed by upper surface 305A and plane 310 parallel with upper surface 303A of piezoelectric substrate 303 is located at top 305B. In this case, angle $\theta_1$ is larger than angle $\theta_2$ in acoustic wave device 301.

Projection 305 has a small volume, and angle $\theta_1$ is larger than angle $\theta_2$ at top 305B, hence providing electrode layer 307 with a large volume. This structure allows electrode fingers 302 to provide a certain reflectivity of the acoustic wave since angle $\theta_1$ is not excessively small. This structure prevents positively the reflectivity from lowering since projection 305 on upper surface 304A of dielectric film 304 is small.

In electrode layer 308 disposed between electrode layer 307 and piezoelectric substrate 303, side surface 308C of electrode layer 308 and plane 311 parallel with upper surface 303A of substrate 303 form angle $\theta_3$ larger than angle $\theta_1$. Angle $\theta_3$ preferably ranges from 85° to 95°, and more preferably, is 90°. In other words, side surface 308C of electrode layer 308 may preferably be substantially perpendicular to upper surface 303A of piezoelectric substrate 303.

A ladder filter or a Double Mode Saw (DMS) filter that includes acoustic wave device 301 requires a relatively large reflectivity of the acoustic wave for each electrode finger 302 in order to obtain preferable filter characteristics. A small reflectivity of each electrode finger 302 may increase an insertion loss in the pass-band of the filter, or may produce ripples having the characteristics deteriorate. A desirable reflectivity per one electrode finger 302 is determined by the desirable pass-band width of the filter. Reflectivity $\gamma$ per one electrode finger 302 and stop-bandwidth SBW of the filter is expressed as formula 1 with a center frequency $f_0$ of the reflection characteristics.

$$\frac{2|\gamma|}{\pi} \approx \frac{SBW}{f_0} \qquad \text{(Formula 1)}$$

If stop-bandwidth SBW is narrower than the pass-bandwidth of the filter, acoustic wave device 301 cannot confine the acoustic wave completely therein at frequencies in the pass-band, and produces a leakage of the acoustic wave, thereby having the pass-band characteristics deteriorate. Angle $\theta_3$ of electrode layer 308 ranging from 85° to 95° provides large reflectivity $\gamma$. Since this reflectivity $\gamma$ has a linear relation as shown in formula 1 with respect to stop-bandwidth SBW, large reflectivity $\gamma$ reduces the insertion loss as well as prevents characteristics from deteriorating due to ripples.

The range of angle $\theta_3$ from 85° to 95° is a range that does not decrease reflectivity $\gamma$ of the acoustic wave in acoustic wave device 301. The shape of the side surfaces (307C, 308C) of electrode finger 302 can be formed by controlling the manufacturing process.

On the cross section of electrode finger 302 perpendicular to extension direction 302P, width L1 of lower surface 307B of electrode layer 307 in propagation direction 302Q of the main acoustic wave is smaller than width L2 of upper surface 308A of electrode layer 308 in propagation direction 302Q. On a cross section of electrode finger 302 perpendicular to extension direction 302P, this structure reduces a width of upper surface 307A of electrode layer 307 in propagation direction 302Q. As a result, this structure further decreases projection 305 formed on upper surface 304A of dielectric film 304, thereby preventing more positively the reflectivity $\gamma$ from decreasing.

Electrode fingers 302 are made of single metal, alloy or a laminated structure. Electrode layer 308 is made of material having an average density larger than that of electrode layer 307. Electrode layer 307 is made of metal having a small resistivity to reduce a resistance loss caused by electrode layer 307. Electrode layer 308 is preferably made mainly of molybdenum (Mo) or tungsten (W). Electrode layer 307 is mainly made of aluminum (Al) or copper (Cu). A preferable height range of electrode layer 307 or 308 changes depending on the metal materials used for these layers. For instance, in the case of a filter having a center frequency of 897 MHz corresponding to a transmission filter for Band 8 specified by the Universal Mobile Telecommunications System (UMTS), for wavelength λ (=4.0 μm) of an acoustic wave determined by pitches P302 of electrode fingers 302, the preferable height of electrode layer 308 ranges from 170 nm to 230 nm, and more preferably, the height is about 200 nm if electrode layer 308 is mainly made of Mo. If electrode layer 308 is mainly made of W, the preferable height of electrode layer 308 ranges from 60 nm to 120 nm, and more preferably, the height is about 90 nm. If electrode layer 307 is mainly made of Al, the preferable height of electrode layer 307 ranges from 250 nm to 350 nm, and more preferably, the height is about 320 nm. Electrode layer 307 is thus preferably thicker than electrode layer 308. Electrode layer 307 out of electrode layers 307 and 308 having a density smaller than that of electrode layer 308 has a volume larger than that of electrode layer 308. This structure reduces a resistance of electrode fingers 302, and reducing a resistance loss accordingly.

Dielectric film 304 may be made of silicon nitride (SiN), aluminum nitride (AlN), tantalum pentoxide ($Ta_2O_5$), tellurium oxide ($TeO_2$, $TeO_3$), or silicon dioxide ($SiO_2$). Dielectric material, such as $SiO_2$, having a temperature coefficient of frequency (TCF) has a sign opposite to that of piezoelectric substrate 303 is preferably used for dielectric film 304, thereby improving the TCF of acoustic wave device 301.

A method for manufacturing acoustic wave device 301 will be detailed below. In this description, electrode layer 307 is made of Al, and electrode layer 308 is made of Mo. FIGS. 15A to 15F are cross-sectional views of acoustic wave device 301 for illustrating processes for manufacturing acoustic wave device 301.

Figure 15A:
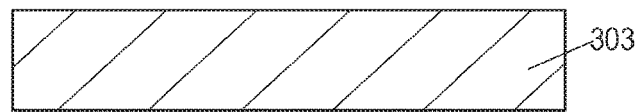
FIGS. 15A to 15F are schematic cross-sectional views of the acoustic wave device in accordance with Embodiment 3 for illustrating processes of manufacturing the acoustic wave device.

First, piezoelectric substrate 303 made of mono-crystal lithium niobate of rotary Y-cut and X propagation is prepared, as shown in FIG. 15A.

Figure 15B:
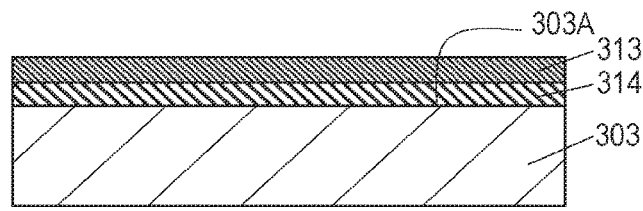

Then, as shown in FIG. 15B, electrode layer 314 made of Mo is formed on upper surface 303A of piezoelectric substrate 303, and electrode layer 313 made of Al is formed on an upper surface of electrode layer 314. Electrode layers 313 and 314 may be formed by depositing these materials by, e.g. a sputtering method.

Figure 15C:
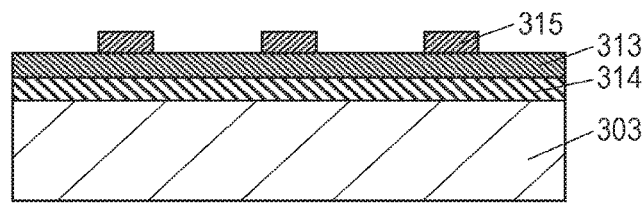

Next, as shown in FIG. 15C, resist 315 having a predetermined pattern is formed on an upper surface of electrode layer 313 by a photolithography technique. Resist 315 has a positive pattern located at a place on electrode layers 313 and 314 to be IDT electrode 321.

Figure 15D:
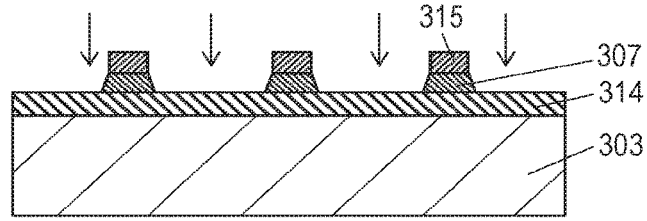
Figure 15E:
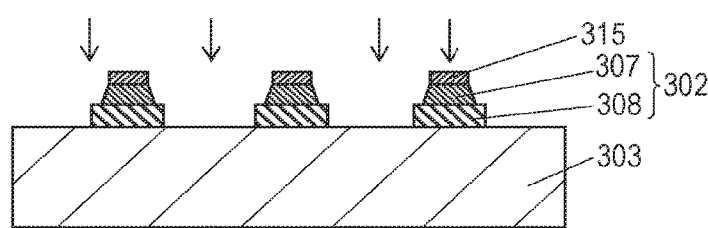

Then, as shown in FIGS. 15D and 15E, electrode fingers 302 (IDT electrode 321) are formed by dry etching.

FIG. 15D shows a process of forming electrode layer 307 mainly made of Al. The dry-etching of Al or Al alloy mainly made of Al employs chlorine as a reactive gas. Chlorine gas for dry-etching Al produces residue made of mixture of, e.g. the resist and Al. This residue suppresses the reacting of the dry etching and provides an extremely low etching rate, so that the residue functions as masking. During the dry-etching of electrode layer 307 mainly made of Al, the residue is attached onto side surface 307C of electrode layer 307. Therefore, on the cross section perpendicular to extension direction 302P of electrode fingers 302, the width of electrode layer 307 in propagation direction 302Q of the main acoustic wave increases as approaching piezoelectric substrate 303.

The amount of the residue depends on a bias electric power during the dry etching. The larger the bias electric power is, the larger the amount of the residue is, so that the masking effect can be increased. As a result, electrode layer 307 has a large width in propagation direction 302Q of the main acoustic wave, thus being thick. The bias electric power is controlled to adjust the amount of etching electrode layer 307, thereby controlling angle $\theta_1$ of electrode layer 307 made of Al.

FIG. 15E shows a process for forming electrode layer 308 mainly made of Mo. A reacting gas made of, for instance, a mixture of chlorine and oxygen allows side surface 308C of electrode layer 308 to be perpendicular to upper surface 308A. The amount of the residue produced during the dry-etching of Al is adjusted to allow the residue to function as a mask for allowing a width of upper surface 308A in propagation direction 302Q of the main acoustic wave to be larger than a width of lower surface 307B in propagation direction 302Q. As shown in FIG. 14, the cross section of electrode layer 307 flares downward, and side surface 308C of electrode layer 308 is perpendicular to upper surface 308A and lower surface 308B. Thus, electrode fingers 302 (IDT electrode 321) has the laminated structure in which width L1 of lower surface 307B of electrode layer 307 in propagation direction 302Q is smaller than width L2 of upper surface 308A of electrode layer 308 in the direction 302Q.

Figure 15F:
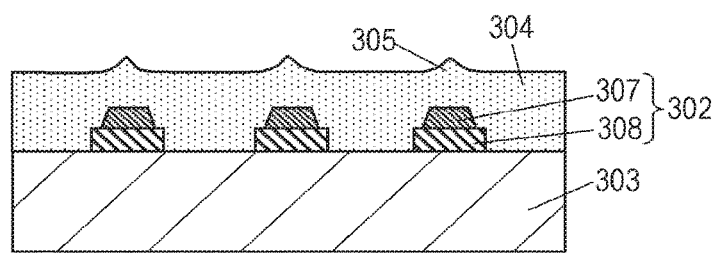

Next, as shown in FIG. 15F, dielectric film 304 covering upper surface 303A of piezoelectric substrate 303 and IDT electrode 321 is formed. Dielectric film 304 is formed by depositing fine particles of material, such as $SiO_2$, by a sputtering method or an evaporation method. During this process, the fine particles of the material are blocked by electrode fingers 302, hence being prevented from filling spaces between electrode fingers 302. The fine particles insufficiently filling the spaces produce voids or sparse regions in dielectric film 304. The voids or sparse regions in dielectric film 304 produce propagation loss of the acoustic wave, and have the electric characteristics of acoustic wave device 301 deteriorate. However, the width of lower surface 307B of electrode layer 307 in propagation direction 302Q smaller than a width of upper surface 308A of electrode layer 308 in direction 302Q allows the fine particles of the material for dielectric film 304 to sufficiently fill the spaces between electrode fingers 302. Angle $\theta_1$ of electrode layer 307 is smaller than angle $\theta_3$ of electrode layer 308, in other words, the cross section of electrode layer 307 flares downward. This shape allows the fine particles of the material of dielectric film 304 to more sufficiently fill the spaces between electrode fingers 302. This prevents the electric characteristics of acoustic wave device 301 including IDT electrode 321 from deteriorating due to the voids or the sparse regions in dielectric film 304.

Figure 16:
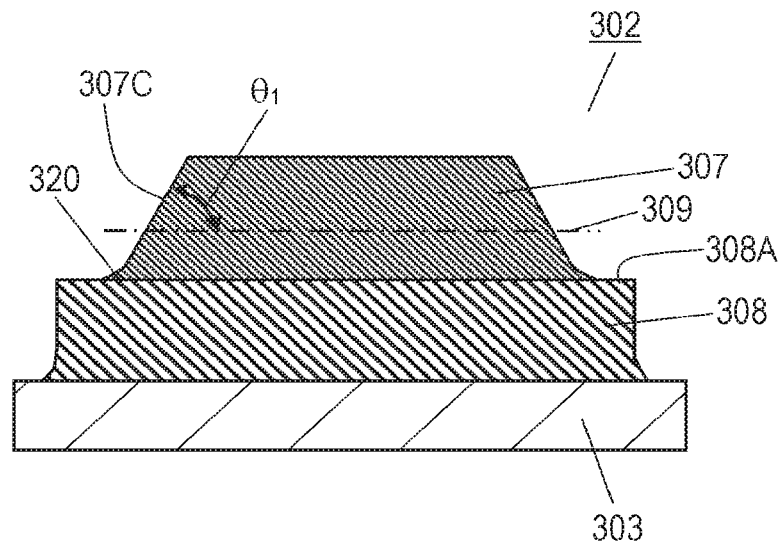
FIG. 16 is an enlarged cross-sectional view of the acoustic wave device in accordance with Embodiment 3.

FIG. 16 is an enlarged cross-sectional view of acoustic wave device 301. As shown in FIG. 16, joint section 320 which is connected smoothly to side surface 307C and upper surface 308A may be formed at a part of side surface 307C of electrode layer 307 that is bonded to upper surface 308A of electrode layer 308. In this case, angle $\theta_1$ is defined as an angle formed by plane 309 and a portion of side surface 307C other than joint section 320.

Angle $\theta_1$ of electrode layer 307 which is an acute angle reduces the height of projections 305 formed above electrode fingers 302 during the lamination of dielectric film 304. Since the width of lower surface 307B of electrode layer 307 in propagation direction 302Q of the main acoustic wave is smaller than that of upper surface 308A of electrode layer 308 in the direction 302Q, the height of projections 305 formed above electrode fingers 302 during the lamination of dielectric film 304 can be reduced.

Figure 23A:
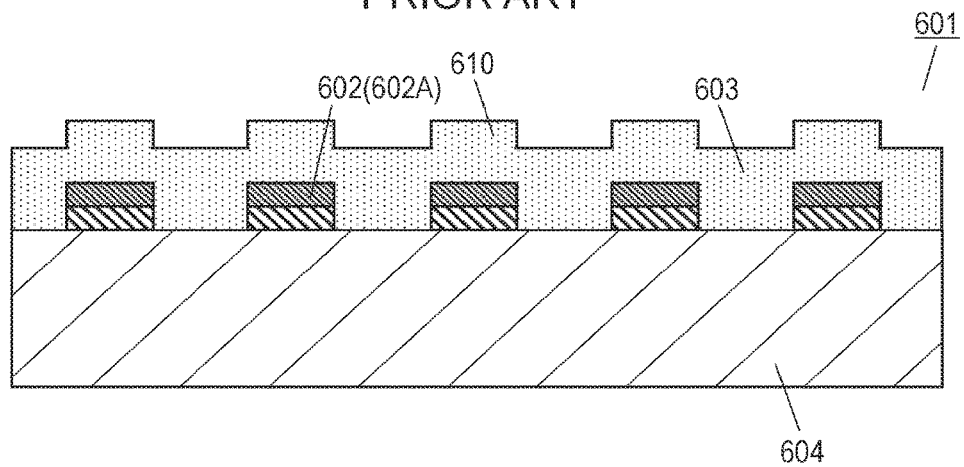
FIG. 23A is a schematic cross-sectional view of another conventional acoustic wave device.
Figure 23B:
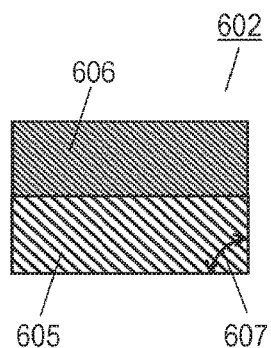
FIG. 23B is an enlarged cross-sectional view of an electrode finger of the acoustic wave device shown in FIG. 23A.
Figure 23C:
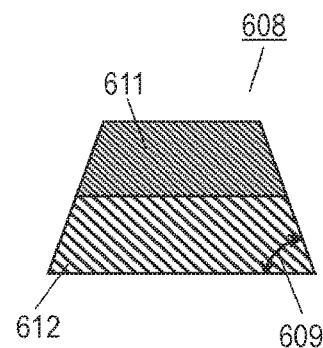
FIG. 23C is an enlarged cross-sectional view of another electrode finger of the acoustic wave device shown in FIG. 23A.

Conventional acoustic wave device 601 shown in FIGS. 23A to 23C has projections 610 on an upper surface of dielectric film 603, and projections 610 protrude by a height of electrode finger 602 above electrode fingers 602. Projections 610 are formed during the forming of dielectric film 603 on piezoelectric substrate 604 to cover electrode fingers 602 of IDT electrode 602A. Projections 610 of dielectric film 603 decreases a reflectivity of acoustic wave device 601. To improve the function of acoustic wave device 601, it is necessary to grind projections 610 to have a smaller size after the forming of dielectric film 603 in the manufacturing process of acoustic wave device 601.

In acoustic wave device 301 in accordance with Embodiment 3, projections 305 produced when dielectric film 304 is formed, scatters the acoustic wave. A higher projection 305 may reduce the reflectivity, and increase the insertion loss due to the scattering of the acoustic wave in the acoustic wave device allowing the Rayleigh wave to propagate as the main acoustic wave.

In ordinary manufacturing processes, since a section having the IDT electrode therein has a height different from a height of a section having no IDT electrode therein, the dielectric film formed on the IDT electrode produces projections on the upper surface of the dielectric film above the electrode fingers. It is necessary to grind these projections to prevent the characteristics of the acoustic wave device from deteriorating.

Acoustic wave device 301 in accordance with Embodiment 3 decreases the heights of projections 305 formed above electrode fingers 302, thereby preventing the acoustic wave from scattering. Even if the process of grinding projections 305 is omitted, the reflectivity and the insertion loss of acoustic wave device 301 can be improved. As a result, the cost of acoustic wave device 301 can be reduced. Meanwhile, to further improve the characteristics of device 301, projections 305 may be ground to have smaller sizes.

Figure 17:
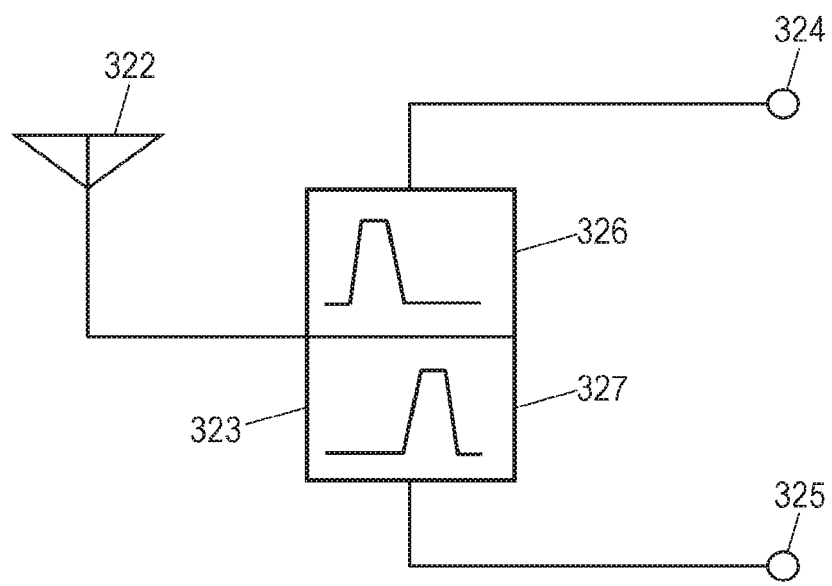
FIG. 17 is a block diagram of an antenna duplexer including the acoustic wave device in accordance with Embodiment 3.

FIG. 17 is a schematic circuit diagram of antenna duplexer 323 employing acoustic wave device 301. Antenna duplexer 323 includes filter 326 having a first pass-band and filter 327 having a second pass-band that is higher than the first pass-band. The lowest frequency of the second pass-band is higher than the highest frequency of the first pass-band. Acoustic wave device 301 is used as filter 326. In A stop-bandwidth of acoustic wave device 301 is important for antenna duplexer 323 having plural pass bands. Filter 326 includes plural series arm resonators and plural parallel arm resonators connected together in a ladder shape. A stop-bandwidth of the series arm resonators influences the passing characteristics of filter 327. Wavelength λ of a main acoustic wave of the series arm resonators of filter 326 is about 4.0 μm. A narrow stop-bandwidth produces ripples in the pass-band of high frequencies, hence having the filter characteristics deteriorate. The stop-bandwidth is required to be wide. In filter 326 used for lower frequencies, the stop-bandwidth of the series arm resonators is preferably twice or greater than twice as wide as the pass-band width.

Figure 18:
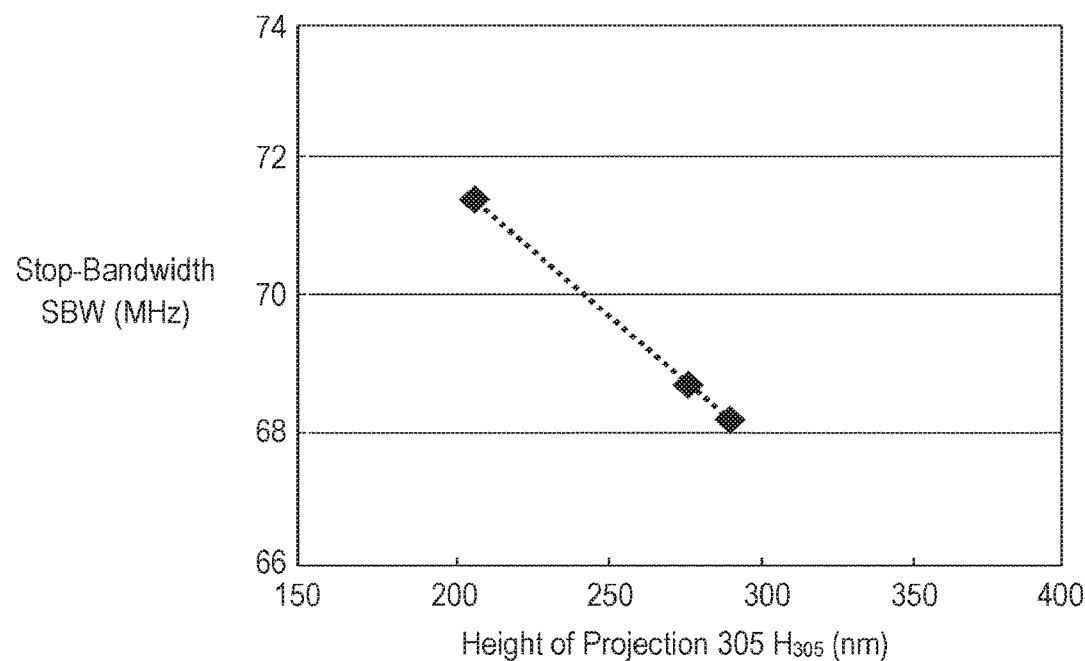
FIG. 18 and FIG. 19 show characteristics of the acoustic wave device in accordance with Embodiment 3.

FIG. 18 shows a relation between height $H_{305}$ of projection 305 from upper surface 304A of dielectric film 304 and stop-bandwidth SBW. Dielectric film 304 is made of $SiO_2$ and provided to acoustic wave device 301 functioning as a filter corresponding to a transmission filter for Band 8 and having a center frequency of 897 MHz. Wavelength λ of the main acoustic wave is 4.0 μm. In FIG. 18, the vertical axis represents the stop-bandwidth SBW (MHz), and the horizontal axis represents height $H_{305}$ of projection 305. The height of electrode finger 302 is fixed at 520 nm. Height $H_{305}$ of projection 305 is changed as a parameter to find stop-bandwidth SBW. Height $H_{305}$ of projection 305 in this case is a distance measured, on the cross section perpendicular to extension direction 302P of electrode finger 302, from the closest point to upper surface 303A of piezoelectric substrate 303 to top 305B of projection 305. Height $H_{302}$ which is a film thickness of electrode finger 302 is measured from the lower surface of electrode finger 302 to the upper surface of electrode finger 302 in the direction perpendicular to upper surface 303A of piezoelectric substrate 303.

Stop-bandwidth SBW is found as 68.2 MH, 68.6 MHz, and 71.4 MHz corresponding to heights $H_{305}$ of 289 nm, 277 nm, and 206 nm, respectively. Therefore, the lower height $H_{305}$ of projection 305 is, the larger stop-bandwidth SBW of acoustic wave device 301 is. Normalized heights $H_{305}/\lambda$ obtained by dividing heights $H_{305}$ of projection 305 by wavelength λ are 0.072, 0.069, and 0.052. Stop-bandwidth SBW/fs normalized by respective resonance frequencies fs (893 MHz, 891 MHz, and 890 MHz) are 0.0764, 0.0770, and 0.0801. Normalized height $H_{305}/\lambda$ normalized by wavelength λ, and normalized stop-bandwidth SBW/fs normalized by resonance frequencies fs do not depend on wavelength λ and resonance frequency fs, respectively, so that the filter is not necessarily limited to a particular filter.

Figure 19:
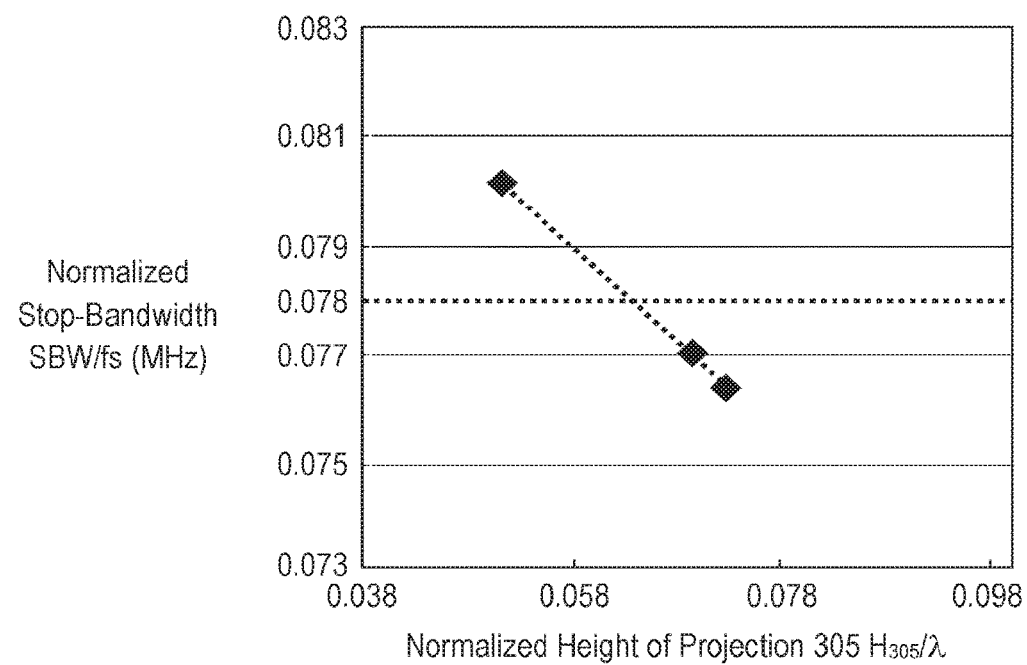

FIG. 19 shows a relation between normalized height $H_{305}/\lambda$ and normalized stop-bandwidth SBW/fs. In FIG. 19, the horizontal axis represents normalized height $H_{305}/\lambda$ of projection 305, and the vertical axis represents normalized stop-bandwidth SBW/fs. Normalized stop-bandwidth SBW/fs is expressed as formula 2.

$$\frac{SBW}{fs} = -\frac{0.179 H_{305}}{\lambda} + 0.0894 \quad \text{(Formula 2)}$$

In acoustic wave device 301 used as the filter working for lower frequencies of antenna duplexer 323, the normalized height $H_{305}/\lambda$ of projection 305 preferably satisfies formula 3 with a relative bandwidth w obtained by dividing the bandwidth by the center frequency.

$$0 < \frac{H_{305}}{\lambda} \leq \frac{1}{0.179}(0.0894 - 2.0w) \quad \text{(Formula 3)}$$

For instance, when antenna duplexer 323 is used as an antenna duplexer for Band 8, the pass-band frequency of filter 326 ranges from 880 MHz to 915 MHz, and center frequency is 897.5 MHz, thus providing the relative bandwidth w of 0.0390. The normalized stop-bandwidth is thus preferably not smaller than 0.0780. The normalized height $H_{305}/\lambda$ of projection 305 preferably ranges from 0 to 0.0637. Height $H_{302}$ of electrode finger 302 is 520 nm and is normalized similarly to height $H_{305}$. Normalized height $H_{302}/\lambda$ normalized by wavelength λ is 0.13. Height $H_{305}$ of projection 305 is thus preferably larger than 0% and not larger than 49.0% of height $H_{302}$ of electrode finger 302.

If an acoustic wave device that does not satisfy formula 3 is used as a filter working on the lower frequencies of the antenna duplexer, the ripples of the series arm resonators overlap the pass-band of the higher frequencies, hence causing the passing characteristics of the antenna duplexer to deteriorate. Acoustic wave device 301 in accordance with Embodiment 3 satisfying formula 3 prevents the passing characteristics on the higher frequencies of antenna duplexer 323 from deteriorating.

Acoustic wave device 301 can be used in a ladder type filter in which the stop-bandwidth of the parallel resonator influences the passing characteristics of the filter. Wavelength λ of the main acoustic wave of the parallel resonator is about 4.2 μm. In the ladder filter, a stop-bandwidth is preferably not narrower than 1.5 times of the pass bandwidth. The normalized height $H_{305}/\lambda$ of acoustic wave device 301 preferably satisfies formula 4 with respect to relative bandwidth w.

$$0 < \frac{H_{305}}{\lambda} \leq \frac{1}{0.179}(0.0894 - 1.5w) \quad \text{(Formula 4)}$$

If an acoustic wave device that does not satisfy formula 4 is used in the ladder filter, the ripples of the parallel resonators overlap the pass-band of the filter, hence causing the passing characteristics of the filter to deteriorate. Acoustic wave device 301 in accordance with Embodiment 3 satisfying formula 4 prevents the passing characteristics of the ladder filter from degrading.

The height of projection 305 of acoustic wave device 301 is determined based on particular relative bandwidth w to widen the stop-bandwidth and to improve the characteristics of acoustic wave device 301.

Figure 20:
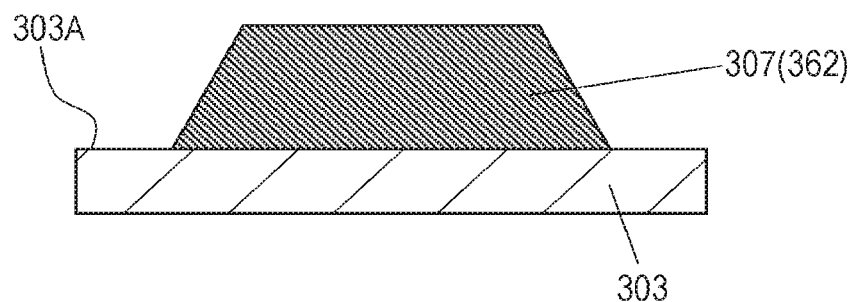
FIG. 20 is a schematic cross-sectional view of another electrode finger of the acoustic wave device in accordance with Embodiment 3.

FIG. 20 is a schematic cross-sectional view of another electrode finger 362 of acoustic wave device 301 in accordance with Embodiment 3. In FIG. 20, components identical to those of electrode finger 302 shown in FIG. 13B are denoted by the same reference numerals. While electrode finger 302 shown in FIG. 13B includes two layers, namely, electrode layers 307 and 308, electrode finger 362 shown in FIG. 20 includes electrode layer 307 disposed on upper surface 303A of piezoelectric substrate 303, namely, electrode finger 362 has a single-layer structure.

Figure 21:
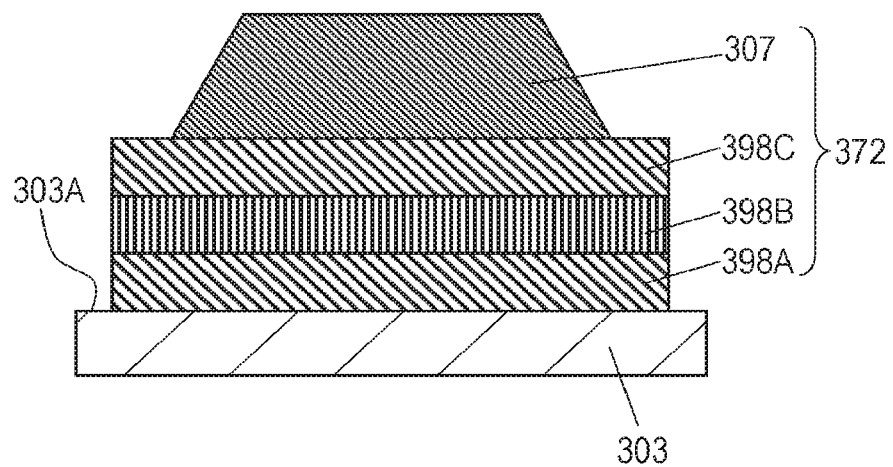
FIG. 21 is a schematic cross-sectional view of still another electrode finger of the acoustic wave device in accordance with Embodiment 3.

FIG. 21 is a schematic cross-sectional view of still another electrode finger 372 of acoustic wave device 301 in accordance with Embodiment 3. In FIG. 21, components identical to those of electrode finger 302 shown in FIG. 13B are denoted by the same reference numerals. Electrode finger 372 shown in FIG. 21 includes electrode layer 398A disposed on upper surface 303A of piezoelectric substrate 303, electrode layer 398B disposed on an upper surface of electrode layer 398A, electrode layer 398C disposed on an upper surface of electrode layer 398B, and electrode layer 307 disposed on an upper surface of electrode layer 398C. Electrode finger 372 thus can include plural layers more than two layers.

In the case that electrode 372 includes plural electrode layers, namely, electrode layers 307 and 398A to 398C, electrode layer 307 is preferably disposed on the top of these layers. This structure allows electrode finger 372 to be tapered in propagation direction 302Q of the main acoustic wave on an upper surface of the cross section perpendicular to extension direction 302P in which electrode finger 372 extends while electrode finger 372 maintains its volume. As a result, the size of projection 305 formed on dielectric film 304 can be further reduced. This structure thus maintains the reflectivity of the acoustic wave excited by electrode finger 372, and yet, the size of projection 305 formed on the upper surface of dielectric film 304 can be reduced, thereby preventing more positively the reflectivity from decreasing.

Acoustic wave device 301 in accordance with Embodiment 3 can be employed in antenna duplexer 10 or electronic apparatus 50 shown in FIG. 7 or 8 similarly to acoustic wave devices 1 and 1C to 1F in accordance with Embodiment 1.

In Embodiments 1 to 3, terms, such as "upper surface", "lower surface", "above", and "below", indicating directions indicate relative directions defined only by relative positional relations of structural elements, such as the piezoelectric substrate, the IDT electrode, and the dielectric film, of the acoustic wave devices, and do not indicate absolute directions, such as a vertical direction.

What is claimed is:

1. An acoustic wave device comprising:
   a piezoelectric substrate having an upper surface;
   an interdigital transducer electrode disposed above the upper surface of the piezoelectric substrate, the interdigital transducer electrode including a plurality of electrode fingers configured to excite a main acoustic wave;
   a first dielectric film made of an oxide and disposed above the upper surface of the piezoelectric substrate and covering the plurality of electrode fingers;
   a second dielectric film made of non-oxide and disposed on upper surfaces of the plurality of electrode fingers and between the first dielectric film and each of the plurality of electrode fingers; and
   a third dielectric film disposed between the piezoelectric substrate and the plurality of electrode fingers, a speed of a transverse wave propagating through the third dielectric film being greater than a speed of the main acoustic wave propagating through the piezoelectric substrate, the third dielectric film contacting the first dielectric film between adjacent electrode fingers of the plurality of electrode fingers.

2. The acoustic wave device of claim 1 wherein the first dielectric film has a temperature coefficient of frequency with a sign opposite to a sign of a temperature coefficient of frequency of the piezoelectric substrate.

3. The acoustic wave device of claim 1 wherein the first dielectric film is made of silicon dioxide.

4. The acoustic wave device of claim 1 wherein the second dielectric film is made of one of a nitride and a carbide.

5. The acoustic wave device of claim 4 wherein the second dielectric film is made of silicon nitride.

6. The acoustic wave device of claim 1 wherein the main acoustic wave is Rayleigh wave.

7. The acoustic wave device of claim 6 wherein the piezoelectric substrate is one of a lithium niobate-based substrate, a potassium niobate-based substrate, a quartz-based substrate, and a lithium tantalite-based substrate.

8. The acoustic wave device of claim 1 wherein the second dielectric film contacts side surfaces of the plurality of electrode fingers.

9. The acoustic wave device of claim 8 wherein film thicknesses of portions of the second dielectric film on the upper surfaces of the plurality of electrode fingers are greater than film thicknesses of portions of the second dielectric film contacting the side surfaces of the plurality of electrode fingers.

10. The acoustic wave device of claim 8 wherein the second dielectric film covers the side surfaces of the plurality of electrode fingers from above the plurality of electrode fingers.

11. The acoustic wave device of claim 10 wherein the second dielectric film covers a portion of each of the side surfaces of the plurality of electrode fingers from above the plurality of electrode fingers but does not reach the upper surface of the piezoelectric substrate.

12. The acoustic wave device of claim 1 wherein a speed of a transverse wave propagating through the second dielectric film is greater than a speed of a transverse wave propagating through the first dielectric film.

13. The acoustic wave device of claim 1 wherein the plurality of electrode fingers have a laminated structure.

14. The acoustic wave device of claim 13 wherein the plurality of electrode fingers include a molybdenum electrode layer made mainly of molybdenum disposed on the upper surface of the piezoelectric substrate and an aluminum electrode layer made mainly of aluminum disposed on the molybdenum electrode layer.

15. The acoustic wave device of claim 14 wherein the molybdenum electrode layer contains an additive including silicon.

16. The acoustic wave device of claim 14 wherein the aluminum electrode layer contains an additive including one or more of magnesium, copper, and silicon.

17. The acoustic wave device of claim 1 wherein the plurality of electrode fingers have a total film thickness of $0.05\lambda*b/a$ or greater and $0.15\lambda*b/a$ or less where b is a total density of the plurality of electrode fingers, a is a density of aluminum, and $\lambda$ is a wavelength determined by twice a pitch of the plurality of electrode fingers.

18. The acoustic wave device of claim 1 wherein a speed of a transverse wave propagating through the second dielectric film is less than a speed of the main acoustic wave propagating through the piezoelectric substrate.

19. The acoustic wave device of claim 1 wherein a speed of a transverse wave propagating through the second dielectric film is greater than a speed of the main acoustic wave propagating through the piezoelectric substrate.

20. The acoustic wave device of claim 1 wherein a speed of a transverse wave propagating through the second dielectric film is greater than a speed of a transverse wave propagating through the first dielectric film.

21. The acoustic wave device of claim 1 wherein the first dielectric film has a film thickness of $0.2\lambda$ or greater and $0.5\lambda$ or less where $\lambda$ is a wavelength determined by twice a pitch of the plurality of electrode fingers.

22. The acoustic wave device of claim 1 wherein the third dielectric film is one of an aluminum oxide film, a diamond film, a silicon nitride film, a silicon nitride oxide film, and an aluminum nitride film.

23. An acoustic wave device comprising:
a piezoelectric substrate having an upper surface;
an IDT electrode disposed above the upper surface of the piezoelectric substrate, the IDT electrode including a plurality of electrode fingers configured to excite a main acoustic wave;
a first dielectric film made of an oxide and disposed above the upper surface of the piezoelectric substrate and covering the plurality of electrode fingers;
a second dielectric film made of non-oxide and disposed on upper surfaces of the plurality of electrode fingers and between the first dielectric film and each of the plurality of electrode fingers; and
a third dielectric film disposed between the piezoelectric substrate and the plurality of electrode fingers, a dielectric constant of the third dielectric film being less than a dielectric constant of the piezoelectric substrate, the third dielectric film contacting the first dielectric film between adjacent electrode fingers of the plurality of electrode fingers.

24. An electronic device comprising:
an acoustic wave device including:
a piezoelectric substrate having an upper surface;
an interdigital transducer electrode disposed above the upper surface of the piezoelectric substrate, the interdigital transducer electrode including a plurality of electrode fingers configured to excite a main acoustic wave;
a first dielectric film made of an oxide and disposed above the upper surface of the piezoelectric substrate and covering the plurality of electrode fingers;
a second dielectric film made of non-oxide and disposed on upper surfaces of the plurality of electrode fingers and between the first dielectric film and each of the plurality of electrode fingers; and
a third dielectric film disposed between the piezoelectric substrate and the plurality of electrode fingers, a speed of a transverse wave propagating through the third dielectric film being greater than a speed of the main acoustic wave propagating through the piezoelectric substrate, the third dielectric film contacting the first dielectric film between adjacent electrode fingers of the plurality of electrode fingers; and a reproducing apparatus coupled to the acoustic wave device.

* * * * *